US012674852B2

(12) United States Patent
Cai et al.

(10) Patent No.: US 12,674,852 B2
(45) Date of Patent: Jul. 7, 2026

(54) MAGNETIC RESONANCE SYSTEM, TRANSMISSION APPARATUS AND TRANSMISSION METHOD

(71) Applicant: GE Precision Healthcare LLC, Waukesha, WI (US)

(72) Inventors: Yanfang Cai, Beijing (CN); Xin Xie, Beijing (CN); Chunlai Xiao, Beijing (CN); Yu Liu, Beijing (CN); Kai Wang, Beijing (CN)

(73) Assignee: GE Precision Healthcare LLC, Waukesha, WI (US)

( * ) Notice: Subject to any disclaimer, the term of this patent is extended or adjusted under 35 U.S.C. 154(b) by 328 days.

(21) Appl. No.: 18/613,597

(22) Filed: Mar. 22, 2024

(65) Prior Publication Data

US 2024/0319300 A1     Sep. 26, 2024

(30) Foreign Application Priority Data

Mar. 24, 2023     (CN) .......................... 202310305796.0

(51) Int. Cl.
*G01R 33/36* (2006.01)
(52) U.S. Cl.
CPC ..... *G01R 33/3607* (2013.01); *G01R 33/3614* (2013.01)

(58) Field of Classification Search
CPC ........................ G01R 33/3607; G01R 33/3614
See application file for complete search history.

(56) References Cited

U.S. PATENT DOCUMENTS

| | | | |
|---|---|---|---|
| 9,535,140 B2 * | 1/2017 | Solomko | ................ G01R 33/09 |
| 9,733,324 B2 * | 8/2017 | Findeklee | ............ H04B 1/0458 |
| 2020/0041587 A1 * | 2/2020 | Findeklkee | ........ G01R 33/3664 |
| 2023/0337933 A1 | 10/2023 | Ning | |

FOREIGN PATENT DOCUMENTS

WO     2017055172 A2     4/2017

* cited by examiner

*Primary Examiner* — Gregory H Curran

(57) ABSTRACT

A magnetic resonance system, a transmission apparatus, and a transmission method is provided. The transmission method includes: generating and outputting a pulse signal by a signal output unit, amplifying the pulse signal by a radio-frequency power amplifier, and transferring, by an impedance matching circuit, the signal amplified by the radio-frequency power amplifier to a transmit coil of the magnetic resonance system; and determining a first phase among a plurality of adjustable phases that enables a performance indicator of the radio-frequency power amplifier to meet a first condition, and adjusting an output impedance of the impedance matching circuit at least according to the first phase.

20 Claims, 9 Drawing Sheets

Signal output unit 201 → RF amplifier 202 → Impedance tuning circuit 203 → Transmit coil load Controller 204

200

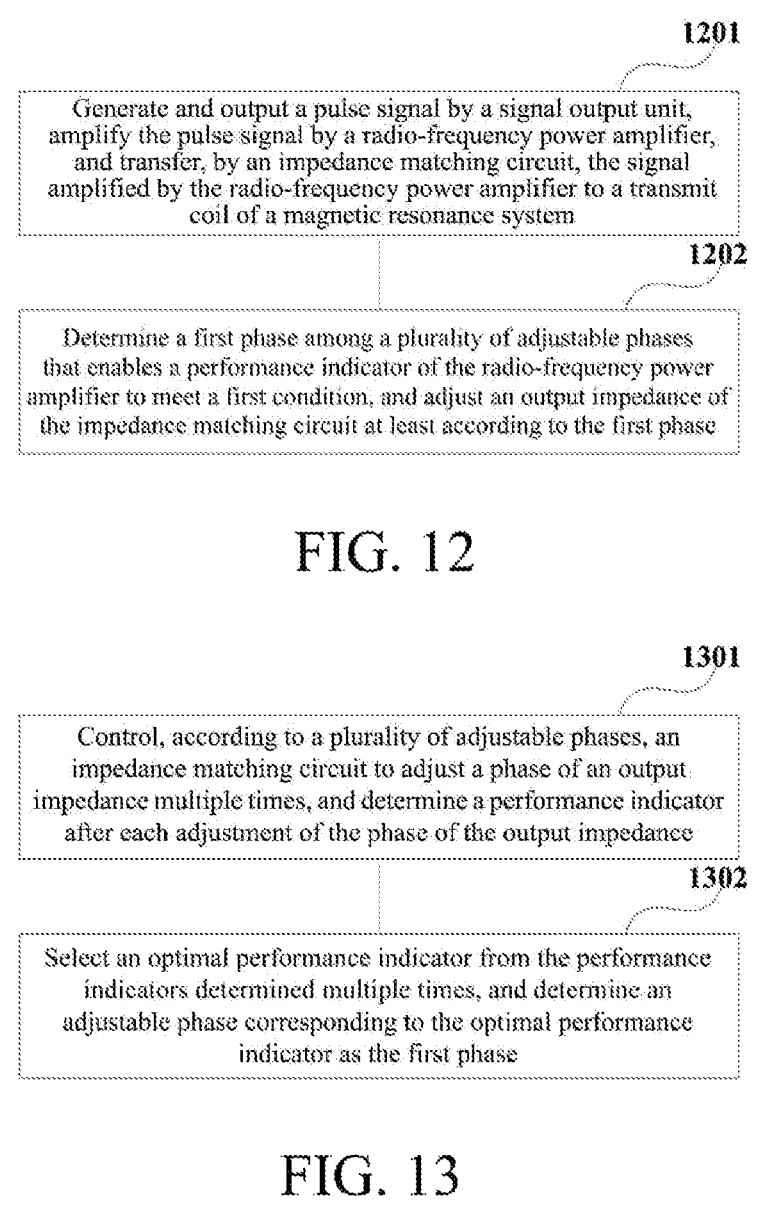

1201

Generate and output a pulse signal by a signal output unit, amplify the pulse signal by a radio-frequency power amplifier, and transfer, by an impedance matching circuit, the signal amplified by the radio-frequency power amplifier to a transmit coil of a magnetic resonance system

1202

Determine a first phase among a plurality of adjustable phases that enables a performance indicator of the radio-frequency power amplifier to meet a first condition, and adjust an output impedance of the impedance matching circuit at least according to the first phase

Control, according to a plurality of adjustable phases, an impedance matching circuit to adjust a phase of an output impedance multiple times, and determine a performance indicator after each adjustment of the phase of the output impedance

1302

Select an optimal performance indicator from the performance indicators determined multiple times, and determine an adjustable phase corresponding to the optimal performance indicator as the first phase

FIG. 13

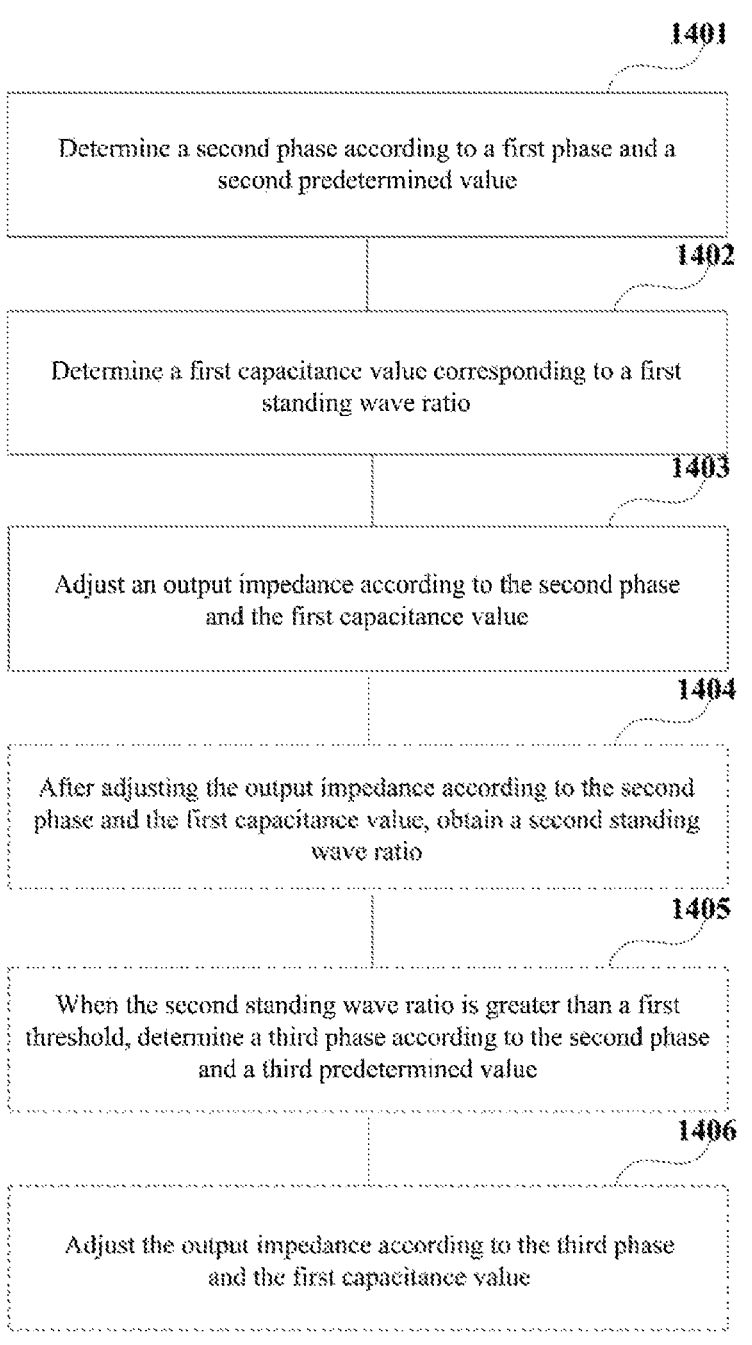

1401

Determine a second phase according to a first phase and a second predetermined value

1402

Determine a first capacitance value corresponding to a first standing wave ratio

1403

Adjust an output impedance according to the second phase and the first capacitance value

1404

After adjusting the output impedance according to the second phase and the first capacitance value, obtain a second standing wave ratio

1405

When the second standing wave ratio is greater than a first threshold, determine a third phase according to the second phase and a third predetermined value

1406

Adjust the output impedance according to the third phase and the first capacitance value

FIG. 14

MAGNETIC RESONANCE SYSTEM, TRANSMISSION APPARATUS AND TRANSMISSION METHOD

CROSS REFERENCE TO RELATED APPLICATIONS

The present application claims priority and benefit of Chinese Patent Application No. 202310305796.0 filed on Mar. 24, 2023, which is incorporated herein by reference in its entirety.

TECHNICAL FIELD

Embodiments of the present application relate to the technical field of medical devices, and relate in particular to a magnetic resonance system, a transmission apparatus and a transmission method.

BACKGROUND

Magnetic resonance (MR) imaging systems are widely used in the field of medical diagnoses. A magnetic resonance system generally has a main magnet, a gradient amplifier, a radio-frequency amplifier, a gradient coil, a transmit chain module, a transmit/receive coil, a receive chain module, etc. The transmit chain module generates a pulse signal and transmits the pulse signal to the transmit/receive coil. The transmit/receive coil generates a radio-frequency excitation signal to excite a scanned subject to generate a magnetic resonance signal. After the excitation, the transmit/receive coil receives the magnetic resonance signal, and a medical parameter image is reconstructed according to the magnetic resonance signal.

In a radio-frequency transmit chain module of a conventional magnetic resonance system, a signal generated by a radio-frequency power amplifier which is outside a scan room (e.g., an equipment room) is transmitted through cables, etc., to a body coil located in the scan room. Since the input impedance of the coil will change along with the weight of the scanned subject, and according to a load-pull theory, the change in load impedance will cause a change in the output characteristics of the radio-frequency power amplifier, which undoubtedly affects the performance (such as fidelity, B1 field strength, etc.) of the transmit chain module. Therefore, in conventional technology, generally, an isolator is added between the power amplifier and the coil in the equipment room, so as to shield the effects of the signal reflected by the coil on the power amplifier, thereby offsetting the impact of the load impedance on the gain of the power amplifier. The foregoing approach will cause higher radio-frequency power loss, and hardware architecture is complex and costly.

SUMMARY

Embodiments of the present application provide a magnetic resonance system, a transmission apparatus and a transmission method.

According to an aspect of the embodiments of the present application, a transmission apparatus of a magnetic resonance system is provided, the apparatus comprises a signal output unit, configured to generate and output a pulse signal and a radio-frequency power amplifier, configured to amplify the pulse signal. The apparatus also includes an impedance matching circuit, which transfers the signal amplified by the radio-frequency power amplifier to a transmit coil of the magnetic resonance system in the same space as the radio-frequency power amplifier. The apparatus further includes a controller, which determines a first phase among a plurality of adjustable phases that enables a performance indicator of the radio-frequency power amplifier to meet a first condition, and adjusts an output impedance of the impedance matching circuit at least according to the first phase.

According to an aspect of the embodiments of the present application, a magnetic resonance system is provided, the system comprises a transmit coil; and the transmission apparatus according to the previous aspect.

According to an aspect of the embodiments of the present application, a transmission method of a magnetic resonance system is provided, the method comprises: generating and outputting a pulse signal by a signal output unit, amplifying the pulse signal by a radio-frequency power amplifier, and transferring, by an impedance matching circuit, the signal amplified by the radio-frequency power amplifier to a transmit coil of the magnetic resonance system. The method also includes determining a first phase among a plurality of adjustable phases that enables a performance indicator of the radio-frequency power amplifier to meet a first condition, and adjusting an output impedance of the impedance matching circuit at least according to the first phase.

According to another aspect of the embodiments of the present application, a storage medium having a computer-readable program stored therein is provided, wherein the computer-readable program enables a computer to implement, in a device, the method described above.

With reference to the following description and drawings, specific implementations of the embodiments of the present application are disclosed in detail, and the means by which the principles of the embodiments of the present application can be employed are illustrated. It should be understood that the implementations of the present application are therefore not limited in scope. Within the scope of the spirit and clauses of the appended claims, the implementations of the present application comprise many changes, modifications, and equivalents.

BRIEF DESCRIPTION OF THE DRAWINGS

The included drawings are used to provide further understanding of the embodiments of the present application, which constitute a part of the description and are used to illustrate the implementations of the present application and explain the principles of the present application together with textual description. Evidently, the drawings in the following description are merely some embodiments of the present application, and a person of ordinary skill in the art may obtain other implementations according to the drawings without involving inventive skill. In the drawings:

FIG. 12 is a schematic diagram of a transmission method according to an embodiment of the present application;

FIG. 13 is a schematic diagram of determining a first phase in 1202 according to an embodiment of the present application;

FIG. 14 is a schematic diagram of impedance adjustment in 1202 according to the embodiment of the present application;

DETAILED DESCRIPTION

Figures 1, 2:
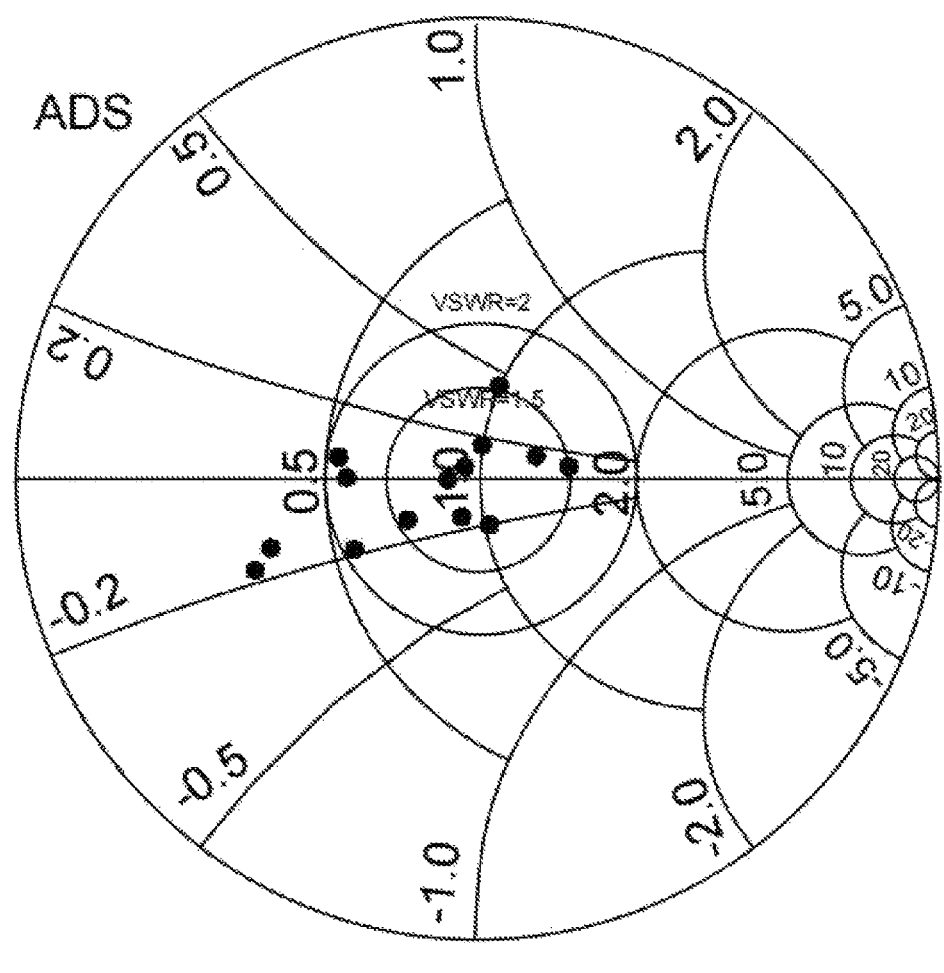
FIG. 1 is a schematic diagram of a Smith chart.
FIG. 2 is a schematic diagram of a transmission apparatus of a magnetic resonance system according to an embodiment of the present application.

The foregoing and other features of the embodiments of the present application will become apparent from the following description and with reference to the drawings. In the description and drawings, specific implementations of the present application are disclosed in detail, and part of the implementations in which the principles of the embodiments of the present application may be employed are indicated. It should be understood that the present application is not limited to the described implementations. On the contrary, the embodiments of the present application include all modifications, variations, and equivalents which fall within the scope of the appended claims.

In the embodiments of the present application, the terms "first", "second" and so on are used to distinguish different elements from one another by their title, but do not represent the spatial arrangement, temporal order, or the like of the elements, and the elements should not be limited by said terms. The term "and/or" includes any one of and all combinations of one or more associated listed terms. The terms "include," "comprise," "have", etc., refer to the presence of described features, elements, components, or assemblies, but do not exclude the presence or addition of one or more other features, elements, components, or assemblies. The terms "connect", "link", "couple", etc., used in the embodiments of the present application are not limited to physical or mechanical connections, but may include electrical connections, whether direct or indirect.

In the embodiments of the present application, the singular forms "a", "the", etc. include plural forms, and should be broadly construed as "a type of" or "a class of" rather than limited to the meaning of "one". Furthermore, the term "said" should be construed as including both the singular and plural forms, unless otherwise specified in the context. In addition, the term "according to" should be construed as "at least in part according to . . . ", and the term "on the basis of" should be construed as "at least in part on the basis of . . . ", unless otherwise specified in the context.

The features described and/or illustrated for one embodiment may be used in one or more other embodiments in an identical or similar manner, combined with features in other embodiments, or replace features in other embodiments. The term "comprise/include" when used herein refers to the presence of features, integrated components, steps, or assemblies, but does not exclude the presence or addition of one or more other features, integrated components, steps, or assemblies.

For ease of understanding, the relevant technologies involved in the present disclosure will be briefly described below.

The purpose of impedance matching is to enable all microwave signals to be transferred to a load with almost no signal being reflected to a source point. Impedance (complex impedance) includes a real resistance part and an imaginary reactance part, which can be expressed as Z=R+jX. Impedance matching means that the load impedance (or input impedance on the load side) is equal to the impedance on the source side of the signal (moduli and amplitude angles are equal, or magnitudes and phases are equal, respectively. The impedance phase may also be regarded as a phase difference between a phase voltage and a phase current). The reactance includes inductive reactance (the opposition caused by inductance to an alternating current) or capacitive reactance (the opposition caused by capacitance to an alternating current).

Admittance is an amount of energy released by a system when a voltage changes, is used to describe the difficulty with which an alternating current passes through a circuit or system, and is represented by a symbol Y and employs siemens as the unit, referred to as (S) for short. Admittance and impedance are reciprocals of each other. Admittance can be expressed in a complex form as Y=G±jB. In the formula, Y is admittance, the real part G is conductance, and the imaginary part B is susceptance. The susceptance includes inductive susceptance (the ability of an inductor to conduct an alternating current) or capacitive susceptance (the ability of a capacitor to conduct an alternating current).

In radio-frequency transmission applications (e.g. magnetic resonance transmit chain modules), return loss, reflection coefficient, and voltage standing wave ratio (VSWR) have always been important reference indicators which can reflect radio-frequency load matching. For example, the VSWR is the ratio of the voltage peak to the voltage valley of a traveling-standing wave (generated by reflected current and voltage on the transmission line), and the VSWR is related to the reflection coefficient Γ as follows:

$$VSWR = \frac{1+\Gamma}{1-\Gamma}.$$

The ideal VSWR is 1:1, and the reflection coefficient is 0, which represents the impedance matching state. When the reflection coefficient modulus is 1, known as total reflection, there is no energy transfer, at which point VSWR is infinite, representing a complete impedance mismatch.

A Smith chart is an image tool used to draw and calculate, for example, the complex impedance, reflection coefficient, standing wave ratio, transmission line effect, etc. FIG. 1 is a schematic diagram of a Smith chart. The complex impedance can be converted into normalized impedance and then expressed on the Smith chart. The normalized impedance is equal to the actual impedance divided by the system impedance. As shown in FIG. 1, the normalized impedance of the center point of the Smith chart is 1. The main axis in the middle is a pure resistance axis (also known as the real axis). The rightmost point of the main axis in the middle represents infinite impedance (open circuit), while the leftmost point of the main axis in the middle represents a short circuit. The resistance values (R) on the same circle (impedance circle) which passes through the infinite point in FIG. 1 are the same. The arc (equal reactance arc) (X) extending from the point representing an open circuit represents that the reactance is a constant. In FIG. 1, the conductance values (G) on the same circle (admittance circle) passing through the short-circuit point are the same, and the arc (equivalent susceptance arc) (B) extending from the point representing the short circuit represents that the susceptance is a constant.

In FIG. 1, the VSWRs of points on the same circle which is centered at the circle center are equal. FIG. 1 shows two circles in which VSWR=1.5 and VSWR=2.0. Making a full revolution on the circle in which VSWR=1.5 or VSWR=2.0 represents half the wavelength of the length of a transmission line. That is, the impedance of the transmission line will be repeated for every change of the length of the transmission line by a half wavelength. Revolving about half a circle represents one quarter of the wavelength. That is, the end of the transmission line is an open circuit. When the length of the transmission line is a one-quarter wavelength, the beginning thereof appears to be short-circuited. From the Smith chart, the process of impedance matching is to move the complex impedance (move along the circle) to a desired position (e.g., as close to the center as possible).

It is currently found that the cable through which the radio-frequency power is transmitted from the radio-frequency power amplifier to the coil introduces high radio-frequency power losses and has complex hardware architecture and high costs. In order to reduce the volume, cost, and power loss of the radio-frequency transmit chain so as to meet the overall demand for low costs, high performance, and the miniaturization of the magnetic resonance system, the radio-frequency power amplifier can be moved into a scan room, thereby allowing the radio-frequency power amplifier to be close to the coil (radio-frequency remoteness), streamlining the hardware architecture and reducing a large number of radio-frequency power cables. Therefore, it is proposed in existing magnetic resonance systems that the radio-frequency power amplifier and the transmit coil can be arranged in the same space.

Since isolators have magnetic components, the isolators cannot operate in a highly magnetic environment, that is, the isolators cannot operate in the scan room. Therefore, when the radio-frequency power amplifier and the transmit coil are in the same space, that is, the radio-frequency power amplifier is moved into the scan room, there is currently no effective solution to eliminate the impact of load changes on the performance (gain, efficiency, output power, etc.) of the radio-frequency power amplifier.

In the embodiments of the present application, when the radio-frequency power amplifier and the coil are arranged in the same space, an impedance matching circuit is arranged between the radio-frequency power amplifier and the transmit coil. By means of the impedance matching circuit, the impedance matching effect can be improved, thereby mitigating load mismatch, implementing the conversion from a high VSWR to a low VSWR, and reducing the impact of load changes on the performance of the radio-frequency power amplifier. Moreover, the transmission apparatus can operate in a strong magnetic field environment, which can meet miniaturization requirements of the transmission apparatus, and also has lower costs.

The embodiments of the present application are specifically described below.

The embodiments of the present application further provide a transmission apparatus of a magnetic resonance system. FIG. 2 is a schematic diagram of a transmission apparatus of a magnetic resonance system according to an embodiment of the present application. As shown in FIG. 2, the apparatus 200 includes: a signal output unit 201, configured to generate and output a pulse signal; a radio-frequency power amplifier 202, configured to amplify the pulse signal. The apparatus 200 also includes an impedance matching circuit 203, which transfers the signal amplified by the radio-frequency power amplifier 202 to a transmit coil of the magnetic resonance system in the same space as the radio-frequency power amplifier 202. Further the apparatus 200 includes a controller 204, which determines a first phase among a plurality of adjustable phases that enables a performance indicator of the radio-frequency power amplifier 202 to meet a first condition, and adjusts an output impedance of the impedance matching circuit 203 at least according to the first phase.

In some embodiments, the signal output unit 201 may include a sequence generator, which may include a digital-to-analog converter and a radio-frequency front-end circuit. The sequence generator generates a scanning sequence (radio-frequency pulse signal) required during an MRI scan according to an instruction. The pulse signal may generate a radio-frequency field for exciting an inversion of a longitudinal magnetization vector of a scanned subject, thereby producing a transverse magnetization vector. The transverse magnetization vector is spirally attenuated at a fixed angular frequency around an external magnetic field to produce a free induction decay signal according to which a magnetic resonance signal for imaging can be obtained. The sequence generator typically generates a low-power radio-frequency pulse signal. Sequence generator the sequence generator is connected to the radio-frequency power amplifier 202, and the pulse signal is inputted into the radio-frequency power amplifier 202. The type of the scanning sequence can be determined as needed, and the embodiments of the present application are not limited thereto. Optionally, the radio-frequency front-end circuit may further include a transmit attenuator not shown in the figure, and is configured to control the attenuation degree of the pulse signal before the pulse signal is inputted into the radio-frequency power amplifier 202. Reference can be made to the prior art for the specific embodiment of the above sequence generator, and the present application is not limited thereto.

In some embodiments, the radio-frequency power amplifier 202 is configured to receive a radio-frequency pulse signal outputted by the signal output unit 201, perform amplification processing, and then output the amplified radio-frequency pulse signal. The radio-frequency power amplifier 202 may perform a series of processing, such as analog-to-digital or digital-to-analog conversion, modulation amplification, filtering processing, etc., on the received radio-frequency pulse signal, so as to output a high-power radio-frequency pulse signal, thereby meeting imaging requirements of the magnetic resonance imaging system. For the structure and type of the radio-frequency power amplifier 202, reference can be made to the prior art, and no further examples will be provided herein.

In some embodiments, the radio-frequency power amplifier 202 and the transmit coil is in the same space, for example, a scan room. More specifically, the radio-frequency power amplifier 202 and the transmit coil may be arranged within a housing of the transmission apparatus or the like, and the embodiments of the present application are not limited thereto.

Since the gain, efficiency, output power and other performance indicators of a power circuit inside the radio-frequency power amplifier 202 are more sensitive to impedance, and the performance is better in the case of impedance matching, the impedance matching circuit 203 is required for impedance matching. How to perform impedance matching will be explained below.

In some embodiments, the controller may obtain a first standing wave ratio of a magnetic resonance transmission chain module. The first standing wave ratio is measured when the impedance matching circuit 203 does not perform impedance matching, or when the impedance matching circuit 203 is not connected between the radio-frequency power amplifier 202 and the transmit coil, or when the signal amplified by the radio-frequency power amplifier 202 is not transferred to the transmit coil via the impedance matching circuit 203. For the measurement of the first standing wave ratio VSWR, reference can be made to the related art, and the embodiments of the present application are not limited thereto.

In some embodiments, when the first standing wave ratio is greater than a first threshold, the first phase is determined. That is, when the first standing wave ratio is greater than the first threshold, it is indicated that current impedance is in a mismatch state. Therefore, impedance matching needs to be performed by means of the impedance matching circuit 203, that is, the first phase needs to be determined. When the first standing wave ratio is less than or equal to the first threshold, it is indicated that the current impedance is in a matching state or is close to the matching state. Therefore, there is no need to perform impedance matching by means of the impedance matching circuit 203. The embodiment of the present application does not define the value of the first threshold. For example, the first threshold may be set to 2 or the like.

In some embodiments, the first phase is selected from among a plurality of adjustable phases, and the impedance matching circuit 203 is controlled according to the first phase to adjust the output impedance so as to perform impedance matching, thereby implementing the conversion from a high VSWR to a low VSWR (for example, the VSWR is reduced to less than or equal to the first threshold), mitigating load mismatch, and reducing the impact of load changes on the performance of the radio-frequency power amplifier. Moreover, the transmission apparatus can operate in a strong magnetic field environment, which can then meet miniaturization requirements of the transmission apparatus, and also has lower costs.

In some embodiments, the output impedance of the impedance matching circuit 203 may also be referred to as input impedance of the transmit coil or input impedance of a load side. The controller 204 selects a first phase among a plurality of adjustable phases. The first phase enables a performance indicator of the radio-frequency power amplifier 202 to meet a first condition. The performance indicator may include gain. The first condition includes that the performance indicator of the radio-frequency power amplifier 202 is optimal, for example, the gain is the maximum. The aforementioned is only an example for illustration, and the embodiments of the present application are not limited thereto. For example, the performance indicator may also be efficiency, maximum output power, etc. For convenience of explanation, the gain will be taken as an example for illustration below.

In some embodiments, the plurality of (M, where M is an integer greater than or equal to 2) adjustable phases are in the range of 0° to 180°, and the M adjustable phases differ in sequence by a first predetermined value K. The unit of K is degrees. That is, the M adjustable phases are 0, K, 2K, 3K, 4K, 5K, . . . , and (M−1)K in sequence, where the value of (M−1)K is less than 180°, or the M adjustable phases are K, 2K, 3K, 4K, 5K, . . . , and MK in sequence, where the value of MK is less than or equal to 180°.

In some embodiments, the first predetermined value K is less than Kmax, and Kmax is, for example, 19°. However, the embodiments of the present application do not define the value of K, and it is determined according to K that (M−1)K is the maximum but less than the value of M of 180°, or it is determined according to K that MK is the maximum but is less than or equal to the value of M of 180°, thereby determining M adjustable phases. For example, the first predetermined value K=15°, M=12, and the 12 adjustable phases include 0°, 15°, 30°, 45°, 60°, 75°, 90°, 105°, 120°, 135°, 150° and 165°. Alternatively, the 12 adjustable phases include 15°, 30°, 45°, 60°, 75°, 90°, 105°, 120°, 135°, 150°, 165° and 180°. For example, the first predetermined value K=18°, M=10, and the 10 adjustable phases include 0°, 18°, 36°, 54°, 72°, 90°, 108°, 126°, 144° and 162°, or 18°, 36°, 54°, 72°, 90°, 108°, 126°, 144°, 162° and 180°. No further examples will be provided herein. For example, K may also be equal to 12°, M=15, or K=7.5°, M=24, etc.

How to select the first phase from among the plurality of adjustable phases will be explained below.

In some embodiments, the impedance matching circuit may be controlled according to the plurality of adjustable phases to adjust a phase of the output impedance multiple times, and the performance indicator is determined after each adjustment of the phase of the output impedance. An optimal performance indicator is selected from the performance indicators determined multiple times, and an adjustable phase corresponding to the optimal performance indicator is determined as the first phase.

In some embodiments, the plurality of adjustable phases may be separately superimposed on an original phase of the output impedance to adjust the phase of the output impedance multiple times. That is, the phase of the output impedance is adjusted multiple times at a step size of K, and the performance indicator is determined after each adjustment of the phase of the output impedance. For example, the phase of the output impedance is adjusted multiple times at the step size of K=15°. 0° is superimposed on the original phase of the output impedance, and gain G1 of the radio-frequency power amplifier 202 after the superimposition of 0° is determined. 15° is superimposed on the original phase of the output impedance, and gain G2 of the radio-frequency power amplifier 202 after the superimposition of 15° is determined. 30° is superimposed on the original phase of the output impedance, and gain G3 of the radio-frequency power amplifier 202 after the superimposition of 30° is determined. 45° is superimposed on the original phase of the output impedance, and gain G4 of the radio-frequency power amplifier 202 after the superimposition of 45° is determined. 60° is superimposed on the original phase of the output impedance, and gain G5 of the radio-frequency power amplifier 202 after the superimposition of 60° is determined. 75° is superimposed on the original phase of the output impedance, and gain G6 of the radio-frequency power amplifier 202 after the superimposition of 75° is determined. 90° is superimposed on the original phase of the output impedance, and gain G7 of the radio-frequency power amplifier 202 after the superimposition of 90° is determined. 105° is superimposed on the original phase of the output impedance, and gain G8 of the radio-frequency power amplifier 202 after the superimposition of 105° is determined. 120° is superimposed on the original phase of the output impedance, and gain G9 of the radio-frequency power amplifier 202 after the superimposition of 120° is determined. 135° is superimposed on the original phase of the output impedance, and gain G10 of the radio-frequency power amplifier 202 after the superimposition of 135° is determined. 150° is superimposed on the original phase of the output impedance, and gain G11 of the radio-frequency power amplifier 202 after the superimposition of 150° is determined. 165° is superimposed on the original phase of the output impedance, and gain G12 of the radio-frequency power amplifier 202 after the superimposition of 165° is determined. It should be noted that the embodiments of the present application do not define the order in which the adjustable phases are superimposed. For example, the adjustable phases may be superimposed in descending order, ascending order, or any order.

In some embodiments, the optimal performance indicator is selected from the performance indicators determined multiple times, and an adjustable phase corresponding to the optimal performance indicator is determined as the first phase. For example, for the determined gains G1 to G12, when the gain G8 is the maximum, the superimposed adjustable phase of 105° corresponding to the gain G8 is determined as the first phase, or when the gain G3 is the maximum, the superimposed adjustable phase of 30° corresponding to the gain G3 is determined as the first phase, which will not be described in detail herein.

How to superimpose the adjustable phases will be explained below.

In some embodiments, the adjustable phases may be superimposed by a phase tuning circuit in the impedance matching circuit. The phase tuning circuit includes P phase lines and a first switch circuit. The first switch circuit is configured to separately control the P phase lines to be in an on state or a short-circuit state. The value of P is a positive integer greater than or equal to 2. The phases of the P phase lines may form M adjustable phases independently or through combination. The controller controls the first switch circuit of the phase tuning circuit to separately adjust the P phase lines to be in the on or short-circuit state, so as to separately superimpose M adjustable phases, thereby adjusting the phase of the output impedance multiple times according to the M adjustable phases. It should be noted that when the phase is adjusted multiple times and the first phase is determined, one end of the phase tuning circuit is connected to an amplifier output end, and the other end of the phase tuning circuit is connected to the transmit coil.

In some embodiments, characteristic impedances Z1, Z2, . . . , and ZP of the P phase lines are the same. For example, all the characteristic impedances of the P phase lines are a system impedance (standard impedance) 50Ω. However, the present application is not limited thereto. For example, the characteristic impedance can also be 75Ω or 300Ω, etc. Through the control of the first switch circuit in the phase tuning circuit, each phase line may be switched between the on state (enabled state) and an off state (disabled state or short-circuit state). The first switch circuit may be implemented using any existing switch circuit or state switching circuit.

In some embodiments, the phases (lengths) of the P phase lines are the same or different. For example, the phases of the P phase lines are $360°×a_1$, $360°×a_2$, $360°×a_3$, . . . , and $360°×a_P$, respectively. In other words, the lengths of the P phase lines are $a_1λ$, $a_2λ$, $a_3λ$, . . . , $a_Pλ$, respectively, wherein $a_1$, $a_2$, $a_3$, . . . , and $a_P$ are exactly the same or completely different, or partially the same and partially different. By taking the values of $a_1$, $a_2$, $a_3$, . . . , and $a_P$, the P phase lines may be combined to allow to form M adjustable phases.

Figure 3:
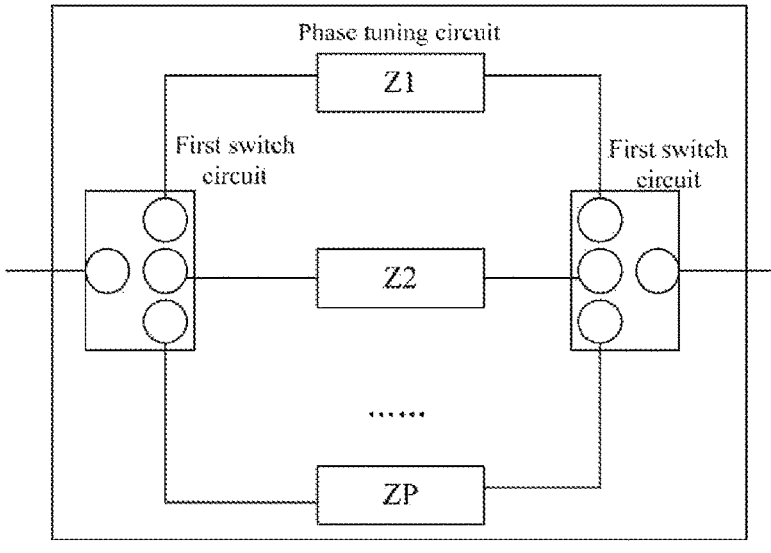
FIG. 3 is a schematic diagram of a phase tuning circuit according to an embodiment of the present application.

For example, the P phase lines may be connected in parallel. FIG. 3 is a schematic diagram of the phase tuning circuit. As shown in FIG. 3, the first switch circuit includes a switching switch connected to each phase line, and the first switch circuit turns on the P phase lines in sequence. When one phase line is turned on, other phase lines are in an open circuit state so as to obtain M adjustable phases. Taking K=15° and M=12 as an example, P=11, and the phases of the P phase lines may be 15°, 30°, 45°, 60°, 75°, 90°, 105°, 120°, 135°, 150° and 165°, or in other words, the lengths of the P phase lines are λ/24, λ/12, λ/8, λ/6, 5λ/24, λ/4, 7λ/24, λ/3, 3λ/8, 5λ/12, and 11λ/24. When only the phase line of 15° is turned on, an adjustable phase of 15° is obtained, that is, the 15° phase is superimposed on the original phase. When only the phase line of 30° is turned on, an adjustable phase of 30° is obtained, that is, the 30° phase is superimposed on the original phase. No further examples will be provided herein.

Figure 4:
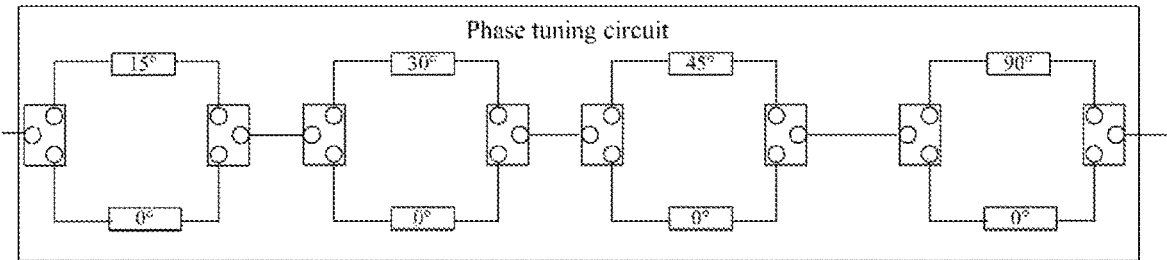
FIG. 4 is a schematic diagram of a phase tuning circuit according to an embodiment of the present application.

For example, the P phase lines may be connected in series. FIG. 4 is a schematic diagram of the phase tuning circuit. As shown in FIG. 4, the first switch circuit includes a switching switch connected to each phase line. The first switch circuit turns on at least one of the P phase lines to obtain M adjustable phases. Taking K=15° and M=12 as an example, P=4, the phases of P phase lines may be 15°, 30°, 45° and 90°, or in other words, the lengths of the P phase lines are λ/24, λ/12, λ/8, and λ/4. When only the phase line of 15° is turned on, an adjustable phase of 15° is obtained, that is, the 15° phase is superimposed on the original phase. When only the phase line of 30° is turned on, an adjustable phase of 30° is obtained, that is, the 30° phase is superimposed on the original phase. When only the phase line of 45° is turned on, an adjustable phase of 45° is obtained, that is, the 45° phase is superimposed on the original phase. When only the phase lines of 15° and 45° are turned on, an adjustable phase of 60° is obtained, that is, the 60° phase is superimposed on the original phase. When only the phase lines of 30° and 45° are turned on, an adjustable phase of 75° is obtained, that is, the 75° phase is superimposed on the original phase. When only the phase line of 90° is turned on, an adjustable phase of 90° is obtained, that is, the 90° phase is superimposed on the original phase. When only the phase lines of 15° and 90° are turned on, an adjustable phase of 105° is obtained, that is, the 105° phase is superimposed on the original phase. When only the phase lines of 30° and 90° are turned on, an adjustable phase of 120° is obtained, that is, the 120° phase is superimposed on the original phase. When only the phase lines of 45° and 90° are turned on, an adjustable phase of 135° is obtained, that is, the 135° phase is superimposed on the original phase. When only the phase lines of 15°, 45° and 90° are turned on, an adjustable phase of 150° is obtained, that is, the 150° phase is superimposed on the original phase. When only the phase lines of 30°, 45° and 90° are turned on, an adjustable phase of 165° is obtained, that is, the 165° phase is superimposed on the original phase. That is, the combinations of only 4 phase lines are required to obtain 12 adjustable phases, which can simplify the phase tuning circuit and reduce costs. It should be noted that the series connection order of the above P phase lines connected in series is not limited.

The above phase lines may be microstrip lines, but the embodiments of the present application are not limited thereto. For example, the phase lines may also be coaxial lines, etc. No further examples will be provided herein. In addition, the phases in the above figure are 0°, that is, the lengths of the phase lines are 0, which means that the phase lines are not connected, or in other words, they are in the short-circuit state. In addition, in the above illustrations, the P phase lines are connected in series or in parallel as an example, but the embodiments of the present application are not limited thereto. The P phase lines may also be combined in series and in parallel. No further examples will be provided herein.

In addition, in FIG. 4 above, K=15°, M=12, P=4, and the phases of the P phase lines may be 15°, 30°, 45° and 90° as an example, but the embodiments of the present application are not limited thereto. For example, K=18°, M=10, P=4, and the phases of the P phase lines may be 18°, 36°, 72° and 90°. No further examples will be provided herein.

How to determine the gain will be explained below.

Figure 17:
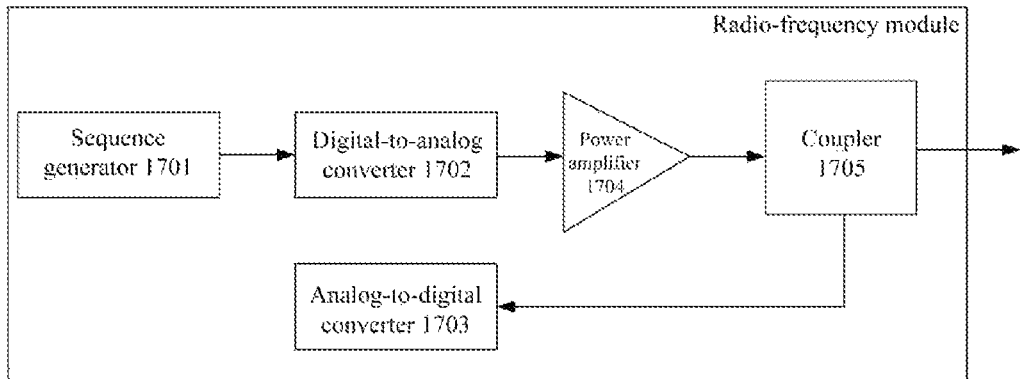
FIG. 17 is a schematic diagram of a configuration of a radio-frequency module according to an embodiment of the present application.

In some embodiments, the gain represents an amplification power amplification factor, represented by a common logarithm of the ratio of output power to input power. The radio-frequency power amplifier 202 may be integrated with a function of calculating the gain thereof. The controller 104 may be connected to the radio-frequency power amplifier 202 to obtain the gain. For example, for convenience of explanation below, the signal output unit 201 and the radio-frequency power amplifier 202 are referred to as a radio-frequency module (RFM). FIG. 17 is a schematic diagram of a configuration of a radio-frequency module according to an embodiment of the present application. As shown in FIG. 17, the radio-frequency module includes a sequence generator 1701, a digital-to-analog conversion module 1702, an analog-to-digital conversion module 1703, a power amplifier 1704, and a coupler 1705. The sequence generator 1701 produces a low-power input signal. For example, the input signal may be Tg 0, but the present application is not limited thereto. The input signal may also be a scanning sequence for actual magnetic resonance scanning, etc. The input signal is a digital signal 1, which is converted into an analog signal by the digital-to-analog conversion module 1702, and is then amplified by the power amplifier 1704. The coupler 1705 may detect the output power of the power amplifier 1704, and the analog signal is converted into a digital signal 2 via the analog-to-digital conversion module 1703. Real-time gain detection may be implemented according to the comparison between the digital signal 1 and the digital signal 2, or the controller 104 may be integrated with the function of calculating the gain of the radio-frequency power amplifier 202. The embodiments of the present application are not limited thereto, and no further examples will be provided herein.

How to perform impedance matching after determining the first phase will be explained below.

In some embodiments, the controller 104 determines a second phase according to the first phase and a second predetermined value, the second phase being equal to the sum of the first phase and the second predetermined value. The second predetermined value is a value that enables the phase of the output impedance after being superimposed with the second phase to be located in a matchable region. The value range of the second predetermined value is [X, Y]. The reason why impedance matching can be performed in the matchable region and how to determine the values of X and Y will be explained later when explaining the principle of impedance matching.

In some embodiments, the phase of the output impedance may be adjusted according to the second phase. That is, after impedance matching, the phase of the output impedance is adjusted to be the original phase superimposed with the second phase. When the second phase is greater than 180°, it may also be said that the original phase of the output impedance is adjusted to be the original phase superimposed with the second phase −180°.

For example, a phase line L1 corresponding to the second predetermined value may be added to the aforementioned phase tuning circuit. The phase line L1 is connected in series with P phase lines. The characteristic impedance of the phase line L1 is the system impedance (standard impedance) 50Ω, but the present application is not limited thereto. For example, it may also be 75Ω or 300Ω. The length of the phase line L1 is the second predetermined value λ/360, and the phase of the phase line L1 is the second predetermined value. During impedance matching, the controller 104 controls to separately adjust the P phase lines to be in the on or short-circuit state so as to obtain the first phase in combination, and then the phase line L1 is turned on. The second predetermined value is superimposed on the basis of the first phase, which is equivalent to adjusting the phase of the output impedance to be the original phase superimposed with the second phase.

For example, in order to further simplify the impedance matching circuit and reduce costs, the second predetermined value or the second phase is a phase that can be obtained through the combination of the P phase lines. Therefore, phase tuning can be implemented without adding an additional phase line L1. During impedance matching, the controller 104 controls to separately adjust the P phase lines to be in the on or short-circuit state, thereby adjusting the phase sum of the P phase lines connected in series to be related to the second phase. For example, when the second phase is less than 180°, the phase sum of the P phase lines is equal to the second phase. When the second phase is greater than or equal to 180°, the phase sum of the P phase lines is equal to the second phase −180°. With FIG. 4 as an example, the second predetermined value may be set to 105°. When the first phase is 30°, the second phase is equal to 135°, and then finally, the phase lines of 45° and 90° are turned on to achieve phase tuning. When the first phase is 105°, the second phase is equal to 210°, and then finally, the phase line of 30° is turned on to achieve phase tuning.

The phase tuning in impedance matching can be implemented as illustrated above. Through this phase tuning, the output impedance can be adjusted to the matchable region. Then, by means of connecting a capacitor in the impedance matching circuit, the impedance force (impedance or admittance) of the output impedance is changed to achieve impedance matching. How to connect the capacitor will be explained below.

In some embodiments, the capacitance adjustment may be implemented by means of the impedance matching circuit. In addition to including the aforementioned phase tuning circuit, the impedance matching circuit may further include one or more capacitors connected in parallel and a second switch circuit. The second switch circuit separately controls the one or more capacitors to be in an on or off state (hereinafter collectively referred to as a capacitance adjustment circuit). One end of the capacitance adjustment circuit is connected in series with the phase tuning circuit, and the other end is connected to the radio-frequency power amplifier. That is, after impedance matching, the signal outputted by the radio-frequency amplifier passes through the capacitance adjustment circuit and the phase tuning circuit in sequence and then is transferred to the transmit coil of the magnetic resonance system.

In some embodiments, one end of each capacitor in the capacitance adjustment circuit is connected to the output end of the radio-frequency power amplifier via the second switch circuit, and the other end of each capacitor is grounded. The number of capacitors and the capacitance value of each capacitor are related to the standing wave ratio. Since the purpose of performing impedance matching is to reduce the standing wave ratio, the number of capacitors and the capacitance value can be determined according to the range of the standing wave ratio to be improved. For example, if the impedance matching circuit is preset to improve the standing wave ratio in three numerical ranges, then three capacitors may be used, the standing wave ratio in each numerical range corresponding to one capacitor. The value of each capacitor is a value that enables the standing wave ratio in the corresponding numerical range to be reduced to less than or equal to the first threshold. How to determine the value will be described later when explaining the impedance matching principle.

In some embodiments, the controller 104 determines a first capacitance value corresponding to the first standing wave ratio, and adjusts the output impedance according to the first capacitance value. That is, the second switch circuit is controlled according to the first capacitance value, namely, to adjust the one or more capacitors to be in the on or off state. After adjusting the one or more capacitors to be in the on or off state, the parallel capacitance value in the impedance matching circuit is the first capacitance value, thereby completing the impedance adjustment.

Figure 5:
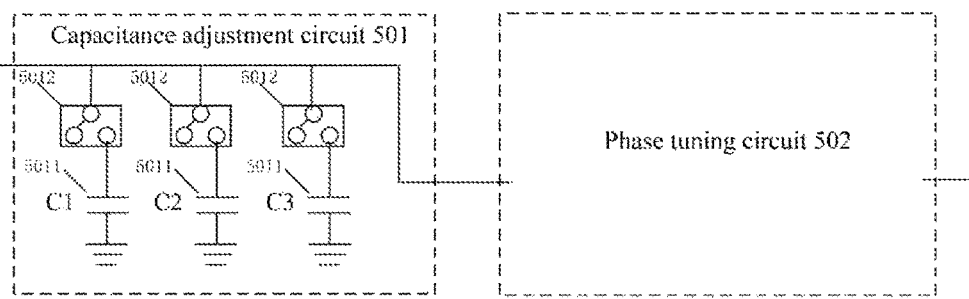
FIG. 5 is a schematic diagram of an impedance matching circuit according to an embodiment of the present application.

FIG. 5 is a schematic diagram of an impedance matching circuit according to an embodiment of the present application. As shown in FIG. 5, the impedance matching circuit includes a capacitance adjustment circuit 501 and a phase tuning circuit 502 connected in series (as described previously, for example, in FIG. 3 or 4). The capacitance adjustment circuit 501 includes one or more capacitors 5011 connected in parallel and a second switch circuit 5012. For example, the one or more capacitors 5011 include capacitors C1, C2 and C3 connected in parallel. Each capacitor corresponds to a standing wave ratio value range to be improved. The controller 104 determines the first capacitance value according to the first standing wave ratio, turns on at least one capacitor corresponding to the first capacitance value, and turns off other capacitors. The capacitance value of the at least one turned-on capacitor connected in parallel is within the value range of the first capacitance value. For example, when the obtained first standing wave ratio is within a first numerical range, only the capacitor C1 is turned on. When the obtained first standing wave ratio is within a second numerical range, only the capacitor C2 is turned on. When the obtained first standing wave ratio is within a third value range, only the capacitor C3 is turned on. For example, when the first standing wave ratio is greater than 4 and less than or equal to 5, it is determined that the value range of the first capacitance value is 28 pF to 50 pF, and then only the capacitor C1 is turned on. For example, the value of C1 is 50 pF, and the standing wave ratio may be reduced to less than or equal to 4. When the first standing wave ratio is greater than 3 and less than or equal to 4, it is determined that the value range of the first capacitance value is 22 pF to 45 pF, and then only the capacitor C2 is turned on. For example, the value of C2 is 30 pF, and the standing wave ratio may be reduced to less than or equal to 3. When the first standing wave ratio is greater than 2 and less than or equal to 3, it is determined that the value range of the first capacitance value is 14 pF to 37 pF, and then only the capacitor C3 is turned on. For example, the value of C3 is 20 pF, and the standing wave ratio may be reduced to less than or equal to 2. That is, in order to directly reduce the standing wave ratio from 5 to be less than or equal to 2, the capacitors C1+C2+C3 can be turned on. No further examples will be provided herein.

Figure 18:
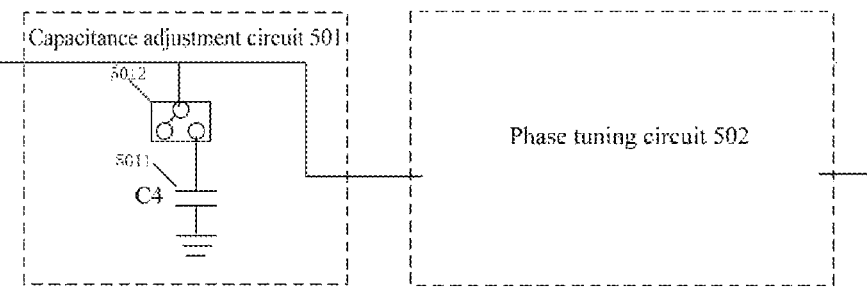
FIG. 18 is a schematic diagram of another impedance matching circuit according to an embodiment of the present application.

The above are only examples for illustration, and the embodiments of the present application are not limited thereto. For example, FIG. 18 is another schematic diagram of an impedance matching circuit according to an embodiment of the present application. As shown in FIG. 18, the difference from the example in FIG. 5 is that the capacitance adjustment circuit 501 may only include one capacitor C4. The value of the capacitor C4 ranges from 28 pF to 36 pF. For a standing wave ratio within 5.8, impedance matching can be performed by means of the capacitor C4 to reduce the standing wave ratio to be less than or equal to 2. Therefore, the circuit is further simplified.

It should be noted that in the process of determining the first phase, the controller 104 controls the second switch circuit to adjust each capacitor to be in an off state. The above impedance matching process will be described in Example 1 described later.

The above capacitance value is determined with a 3 Tesla (T) magnetic resonance system as an example. When the frequency of the magnetic resonance system changes, the capacitance value also changes accordingly. For specific changes, reference may be made to the prior art. For example, the corresponding capacitance value of a 1.5 Tesla (T) magnetic resonance system is twice the corresponding capacitance value of the 3 Tesla (T) magnetic resonance system. No further examples will be provided herein.

The inventors also found that in some scenarios, after performing impedance matching according to the second phase and the first capacitance value, the standing wave ratio can be reduced, but cannot be reduced to less than or equal to the first threshold. Therefore, after adjusting the output impedance according to the second phase and the first capacitance value, the controller 104 can obtain a second standing wave ratio, determine a third phase according to the second phase and a third predetermined value when the second standing wave ratio is greater than the first threshold, and adjust the output impedance according to the third phase and the first capacitance value. The process of adjusting the output impedance according to the first capacitance value is the same as the previous embodiment and will not be described again here.

In some embodiments, the controller 104 obtains the second standing wave ratio in the same implementation manner as obtaining the first standing wave ratio, and determines a third phase according to the second phase and a third predetermined value, the third phase being equal to the sum of the second phase and the third predetermined value. The value of the third predetermined value may be equal to K. The reason why the third predetermined value is added will be described later when explaining the impedance matching principle.

In some embodiments, the phase of the output impedance may be adjusted according to the third phase. That is, after impedance matching, the phase of the output impedance is adjusted to be the original phase superimposed with the third phase. When the third phase is greater than 180°, it may also be said that the original phase of the output impedance is adjusted to be the original phase superimposed with the third phase −180°.

For example, a phase line L2 corresponding to the third predetermined value may be added to the aforementioned phase tuning circuit. The phase line L2 is connected in series with P phase lines. The characteristic impedance of the phase line L2 is the system impedance (standard impedance) 50Ω, but the present application is not limited thereto. For example, it may also be 75Ω or 300Ω. The length of the phase line L2 is the third predetermined value λ/360, and the phase of the phase line L2 is the third predetermined value. During impedance matching, the controller 104 controls to separately adjust the P phase lines to be in the on or short-circuit state, so as to obtain the first phase via combination, and then the phase line L1 and the phase line L2 are turned on. The second predetermined value and the third predetermined value are superimposed on the basis of the first phase, which is equivalent to adjusting the phase of the output impedance to be the original phase superimposed with the third phase. Alternatively, the controller 104 controls to separately adjust the P phase lines to be in the on or short-circuit state, so as to obtain the second phase via combination, and then the phase line L2 is turned on. The third predetermined value is superimposed on the basis of the second phase, which is equivalent to adjusting the phase of the output impedance to be the original phase superimposed with the third phase.

For example, in order to further simplify the impedance matching circuit and reduce costs, since the value of the third predetermined value is equal to K, the third predetermined value or the third phase is a phase that can be obtained through the combination of P phase lines. Therefore, phase tuning can be implemented without adding an additional phase line L2. During impedance matching, the controller 104 controls to separately adjust the P phase lines to be in the on or short-circuit state, thereby adjusting the phase sum of the P phase lines connected in series to be related to the third phase. For example, when the third phase is less than 180°, the phase sum of the P phase lines is equal to the third phase. When the third phase is greater than or equal to 180°, the phase sum of the P phase lines is equal to the third phase −180°. Taking FIG. 4 as an example, the third predetermined value may be set to 15°, and the second predetermined value may be set to 105°. When the first phase is 30°, the third phase is equal to 150°, and then finally, the phase lines of 15°, 45° and 90° are turned on to achieve phase tuning. When the first phase is 105°, the third phase is equal to 225°, and then finally, the phase line of 45° is turned on to achieve phase tuning. The above impedance matching process will be described in Example 2 described later.

It should be noted that the second standing wave ratio is obtained when the output impedance is adjusted according to the second phase and the first capacitance value. That is, essentially, when the second standing wave ratio is greater than the first threshold, there is no need to re-change the switch state of each capacitor in the capacitance adjustment circuit, and only the superimposition of the phase of the third predetermined value on the phase tuning circuit is required to complete the adjustment of the output impedance.

The correspondence relationships between the plurality of adjustable phases, the second phase (or the second phase −180°), the third phase (or the third phase −180°) and the enabling or disabling of the P phase lines described above may be pre-stored in a relationship table, for example, as shown in Table 1 below (taking FIG. 4 as an example). The controller 104 controls the second switch circuit according to the relationship table to separately adjust the P phase lines to be in the on or short-circuit state.

TABLE 1

| Correspondence relationship table of phases and P phase lines | | | | |
|---|---|---|---|---|
| Phase | 15° phase line | 30° phase line | 45° phase line | 90° phase line |
| 15° | On | Short circuit | Short circuit | Short circuit |
| 30° | Short circuit | On | Short circuit | Short circuit |
| 45° | Short circuit | Short circuit | On | Short circuit |
| 60° | On | Short circuit | On | Short circuit |
| 75° | Short circuit | On | On | Short circuit |
| 90° | Short circuit | Short circuit | Short circuit | On |
| 105° | On | Short circuit | Short circuit | On |
| 120° | Short circuit | On | Short circuit | On |
| 135° | Short circuit | Short circuit | On | On |
| 150° | On | Short circuit | On | On |
| 165° | Short circuit | On | On | On |

In addition, the size of the above wavelength λ is related to the frequency of the magnetic resonance system. For example, λ of the 1.5 Tesla (T) magnetic resonance system is twice λ of the 3 Tesla (T) magnetic resonance system. For a specific calculation method of λ, reference may be made to the prior art, and it will not be described in detail here.

Figure 6:
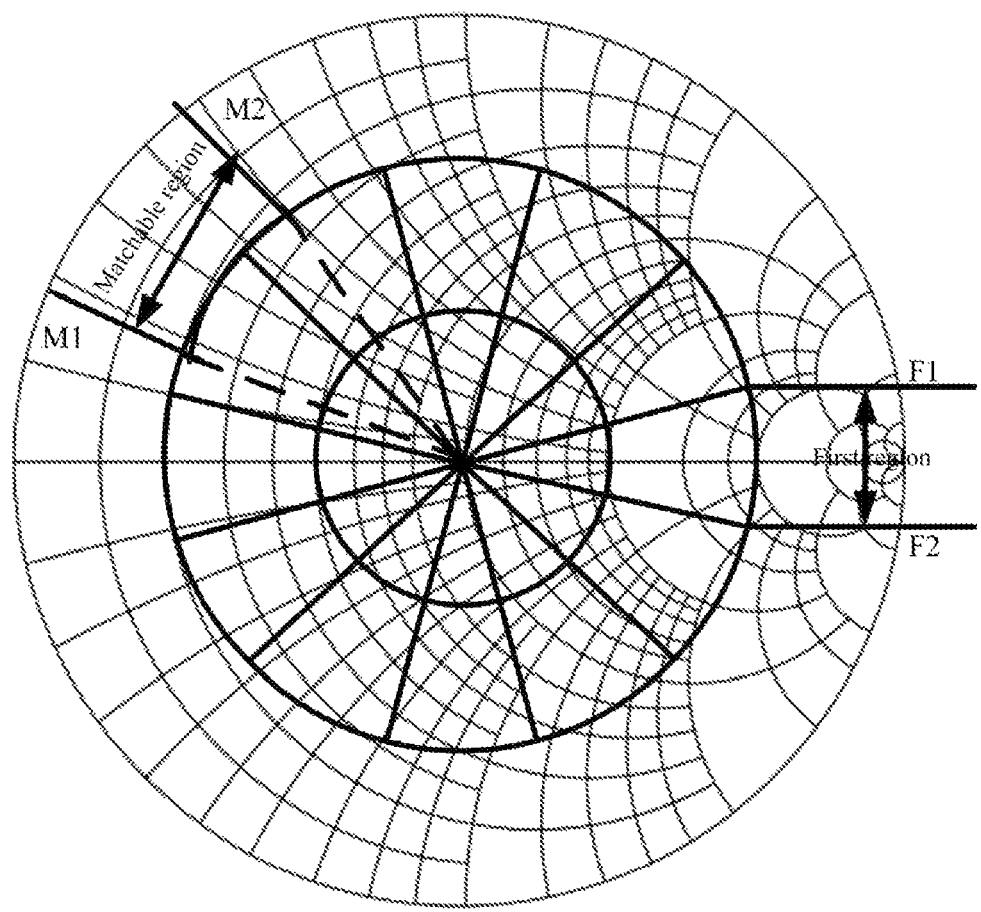
FIG. 6 is a schematic diagram of a simplified Smith chart.
Figure 7:
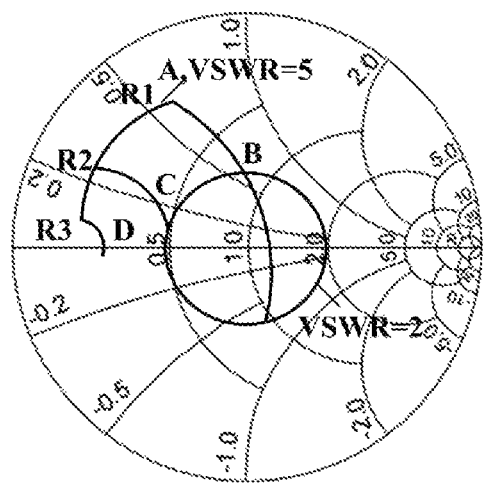
FIG. 7 is a schematic diagram of a simplified Smith chart.
Figure 8:
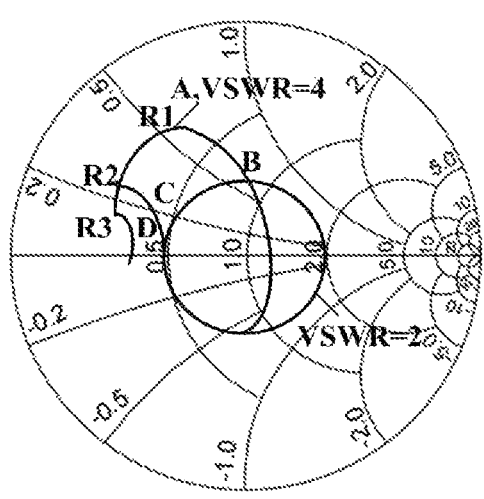
FIG. 8 is a schematic diagram of a simplified Smith chart.

The working principle of impedance matching will be explained below in conjunction with the Smith chart. FIG. 6 is a simplified schematic diagram of a Smith chart. As shown in FIG. 6, the output impedance may be located in any region, not on the real axis. According to the Smith chart rule, the VSWR is the same everywhere on a circle (hereinafter referred to as a VSWR circle) centered at the circle center of the Smith chart. That is, if the output impedance rotates along the VSWR circle passing through the output impedance, the VSWR does not change. The phase tuning circuit adjusts the phase of the output impedance, which is equivalent to causing the output impedance to rotate along the VSWR circle. According to the working principle of the radio-frequency power amplifier, the greater the impedance, the greater the gain, and the closer to the rightmost point of the main axis on the Smith chart, the greater the impedance. Therefore, when the phase tuning circuit first adjusts the phase of the output impedance so that the output impedance rotates to a first region, it means that the corresponding gain of the radio-frequency power amplifier at this time is the highest. In the first region, the phase of the output impedance is then superimposed with the second predetermined value, so that the output impedance continues to rotate along the VSWR circle to a matchable region. That is, the goal of the phase tuning circuit is to enable the output impedance after impedance tuning to be in the matchable region. At this time, the output impedance is adjusted to $$Z1 = Z_0 \times \frac{Z_L + j \times Z_0 + \tan(n \times K)}{Z_0 + j \times Z_L + \tan(n \times K)},$$

where $Z_L$ is load impedance, and n×K is equal to the second phase (or the third phase), and $Z_0$ is source impedance. The reason why impedance matching can be further performed after the output impedance is located in the matchable region will be explained below. According to the Smith chart rule, if parallel capacitance is Ca during the impedance matching, the output impedance will rotate clockwise along an admittance circle where it is located, and the output impedance Z2 after the parallel capacitance will be adjusted to Z1//capacitance Ca. Since $$\Gamma = \frac{Z2 - Z_0}{Z2 + Z_0},$$

and $$VSWR = \frac{1 + \Gamma}{1 - \Gamma},$$

the values of capacitance Ca and the second phase (or the third phase) can be derived according to an actual measured value and target value of VSWR. FIGS. 7 and 8 are simplified schematic diagrams of a Smith chart. As shown in FIG. 7, a VSWR corresponding to the impedance located on an arc A is 5. As shown in FIG. 8, a VSWR corresponding to the impedance located on the arc A is 4. The impedances R1, R2 and R3 on the arc A rotate clockwise along arcs B, C and D on an admittance circle, wherein the impedances R1 and R2 can rotate to a circle with a VSWR of 2. That is, after parallel capacitance on the basis of R1 and R2, the VSWR can be reduced to 2. However, even if R3 rotates clockwise along an admittance circle D, it will never be able to rotate to the circle with the VSWR of 2. Therefore, the effect of reducing the VSWR to 2 cannot be achieved. According to the above example, it can be seen that after impedance matching is performed on the impedance in the matchable region according to the parallel capacitance, the VSWR can be reduced to 2. However, no matter how the impedance not located in the matchable region is adjusted according to the parallel capacitance, the VSWR cannot be reduced to 2. Therefore, the range of the matchable region can be determined on the Smith chart. For example, as shown in FIG. 6, the included angle between a real axis in a first region and an edge line M1 of the matchable region is 90°+14.5°, and the included angle between the real axis in the first region and an edge line M2 of the matchable region is 90°+38°. When K=15°, the included angle between an edge line F1 of the first region and M2 is 90°+38°+7.5°, the included angle between an edge line F2 of the first region and M1 is 90°+14.5°−7.5°, and then, it is deduced according to the included angle range of the matchable region and the first region that the range [X, Y] of the second predetermined value is [97°, 135.5° ]. In the embodiments of the present application, in order to simplify the circuit, the second predetermined value is set to 105° and the third predetermined value is set to 15°. It should be noted that when it is judged according to the standing wave ratio that the third predetermined value needs to be superimposed, the second predetermined value plus the third predetermined value cannot exceed the Y value. In addition, the size of the parallel capacitance can be deduced according to the size of a current VSWR and a target VSWR. For example, the length of an arc (such as B or C) on an admittance circle connecting the current VSWR circle and the target VSWR circle is calculated, and the size of the capacitance is determined according to the length of the arc. For details, reference may be made to the prior art, which will not be described herein again. For example, in the embodiments of the present application, in order to simplify the circuit, the capacitance adjustment circuit includes a capacitor. The value range of the capacitor C4 is 28 pF to 36 pF. By means of the capacitor, for the standing wave ratio within 5.8, impedance matching can be performed until the standing wave ratio is reduced to less than or equal to 2.

Figure 9:
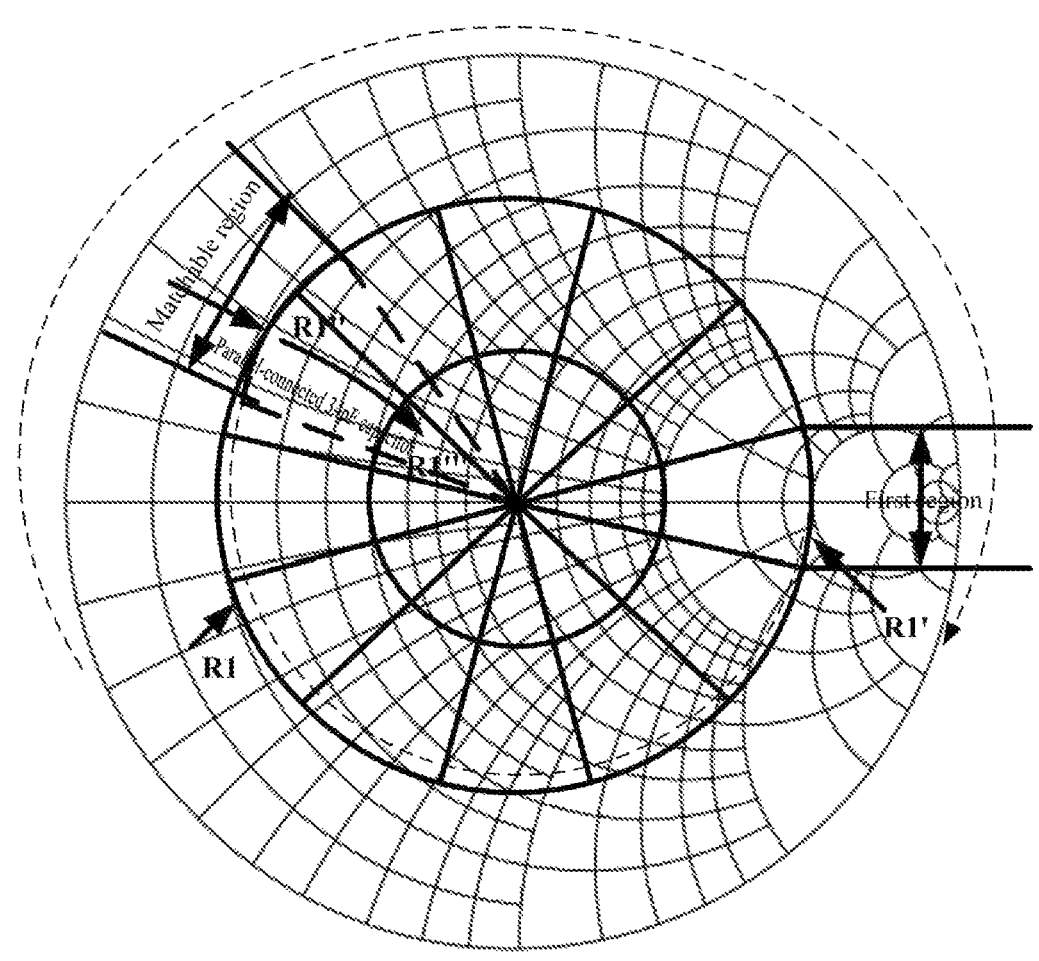
FIG. 9 is a schematic diagram of an impedance matching example according to an embodiment of the present application.

FIG. 9 is a schematic diagram of Example 1 of impedance matching according to an embodiment of the present application. As shown in FIG. 9, the original phase of the current impedance R1 is −13°, and the first VSWR is equal to 5. The phase of the output impedance is adjusted multiple times according to a step size of 15°. The first phase is determined to be 105°, and the maximum gain can be obtained, that is, the impedance is rotated to the first region to obtain R1'. On this basis, the second predetermined value 105° is superimposed, and the second phase is finally determined to be 210°, that is, the phase tuning circuit is controlled to turn on only the 30° phase line to complete the phase tuning. That is, the impedance is rotated to the matchable region to obtain R1". On this basis, C4 is turned on. For example, a 34 pF capacitor is connected in parallel to obtain R1''', which can reduce the VSWR to 2.

Figure 10:
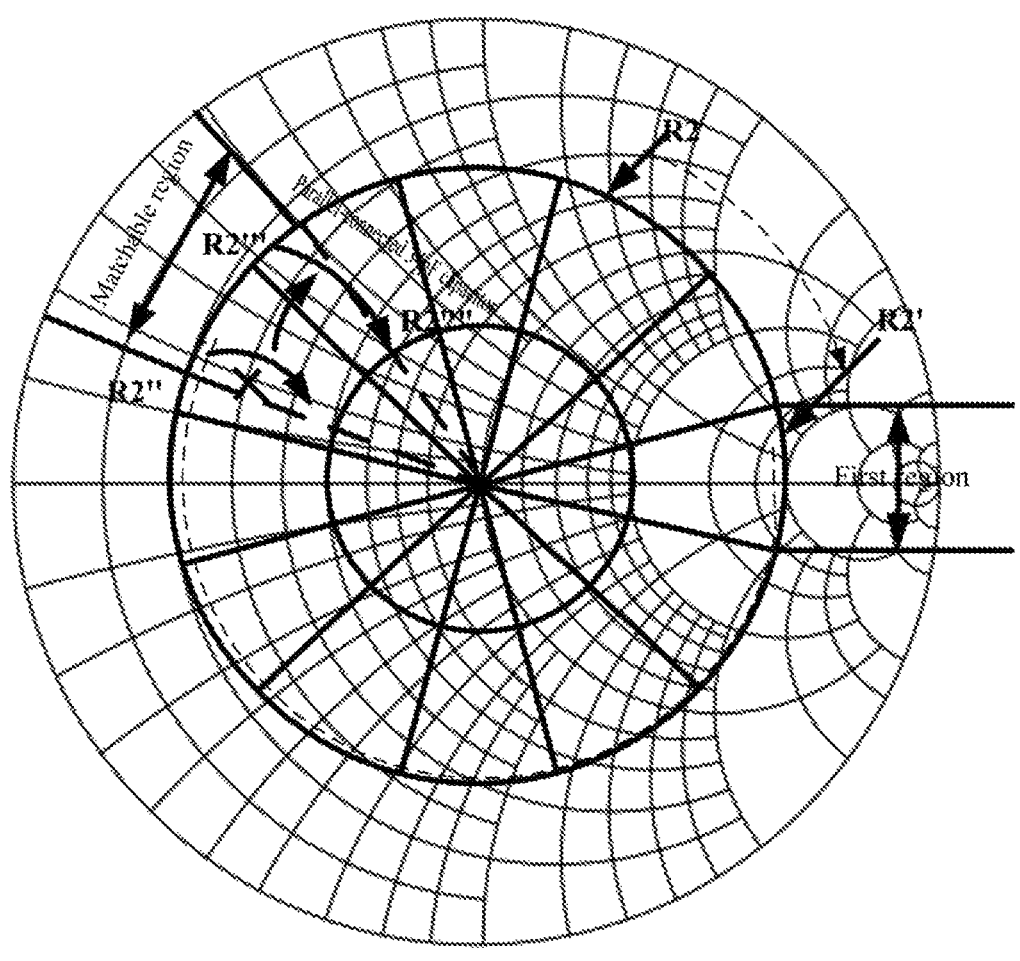
FIG. 10 is a schematic diagram of an impedance matching example according to an embodiment of the present application.

FIG. 10 is a schematic diagram of Example 2 of impedance matching according to an embodiment of the present application. The original phase of the current impedance R2 is 55°, and the first VSWR is equal to 5. The phase of the output impedance is adjusted multiple times according to the step size of 15°. The first phase is determined to be 30°, and the maximum gain can be obtained, that is, the impedance is rotated to the first region to obtain R2'. On this basis, the second predetermined value 105° is superimposed, and the second phase is finally determined to be 135°, that is, the phase tuning circuit is controlled to turn on only the phase lines of 45° and 90° to complete phase tuning. That is, the impedance is rotated to the matchable region to obtain R2". On this basis, C4 is turned on. For example, a 34 pF capacitor is connected in parallel, but the VSWR still cannot be reduced to 2. Then, it is necessary to superimpose the 15° (the third predetermined value) phase again. That is, only the phase lines of 15°, 45° and 90° are turned on to obtain R2''', and C4 (for example, 34 pF) is turned on to obtain R2'''', which can reduce the VSWR to 2.

In some embodiments, the controller 104 may be implemented as a general-purpose processor, a digital signal processor (DSP), an application-specific integrated circuit (ASIC), a field-programmable gate array (FPGA) or other programmable logic devices, a discrete gate or transistor logic device, a discrete hardware component, or any suitable combination thereof, for performing the functions described in the present invention. The embodiments of the present application are not limited thereto.

In some embodiments, the transmission apparatus may include at least one (D) impedance matching circuit 203, the value of D being related to (e.g., the same as) the number of transmit coil channels. Each channel is correspondingly connected to one impedance matching circuit. The number of phase lines, the number of capacitors, and specific values of the D impedance matching circuits may be the same or different, and the embodiments of the present application are not limited thereto.

Figure 11:
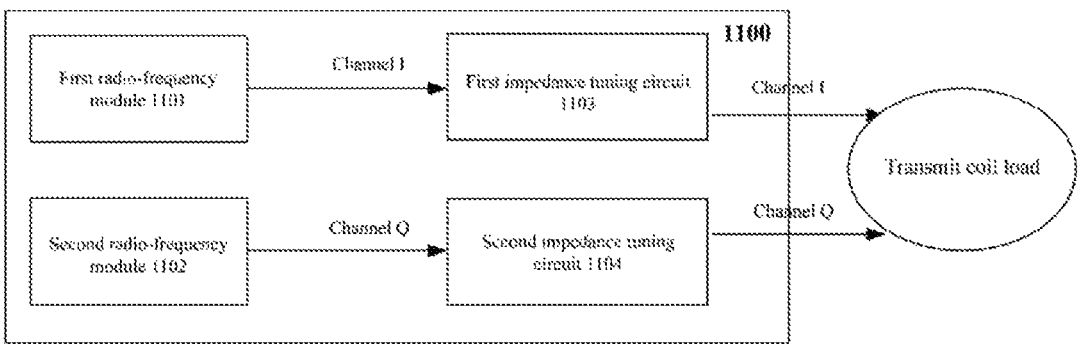
FIG. 11 is a schematic diagram of a transmission apparatus of a magnetic resonance system according to an embodiment of the present application.

In a 3 Tesla (T) magnetic resonance system, the value of D is 1 when the transmit coil has one channel, and the value of D is 2 when the transmit coil includes independent I and Q channels, i.e., two channels. No further examples will be provided herein. FIG. 11 is a schematic diagram of the structure of a dual-channel drive transmission apparatus. As shown in FIG. 11, when the transmit coil (body coil) includes independent I-channel and Q-channel input ports, the transmission apparatus 1100 includes: a first radio-frequency module 1101 and a second radio-frequency module 1102, which drive the I-channel and Q-channel input ports, respectively. The implementations of the first radio-frequency module 1101 and the second radio-frequency module 1102 are as described previously and will not be described again here. Regarding the implementations of an I-channel and Q-channel independent dual drive mode, reference may be made to the prior art, and no further examples will be provided herein. A first impedance matching circuit 1103, transfers a signal amplified by the first radio-frequency module 1101 to the I-channel input port of the transmit coil. A second impedance matching circuit 1104 transfers the signal amplified by the first radio-frequency module 1101 to the Q-channel input port of the transmit coil.

In some embodiments, the implementations of the first impedance matching circuit 1103 and the second impedance matching circuit 1104 are as described previously, and will not be described again here. The number of phase lines, the number of capacitors, and specific values of the first impedance matching circuit 1103 and the second impedance matching circuit 1104 may be the same or different, and the embodiments of the present application are not limited thereto.

In some embodiments, the transmission apparatus 200 or 1100 may further include: a signal processing unit (not shown in the figure), which outputs a feedback signal to the signal output unit. Optionally, the signal processing unit may include a transmit/receive mode-switching switch which is not shown in the figure, and which is controlled by a pulse signal from the sequence generator to electrically connect the radio-frequency power amplifier and impedance matching circuit to the transmit coil of the magnetic resonance system during the transmit mode. In addition, the signal processing unit will receive a portion of reflected signals generated by the scanned subject.

In some embodiments, the feedback signal includes a forward feedback signal and a reverse feedback signal, the forward feedback signal being a feedback signal outputted directly from the signal processing unit, i.e., a feedback signal at the front end of the transmit coil, and the reverse feedback signal being a feedback signal returned from the transmit coil after a radio-frequency pulse signal is amplified and reaches the transmit coil, i.e., a feedback signal at the rear end of the transmit coil. For example, a coupler 1705 may be used to separate to a coupling end thereof a small portion of a sampled signal from a signal inputted from an input terminal, so that the controller uses the separated signal to obtain the forward power, reverse power, voltage standing wave ratio (VSWR), return loss, radio-frequency energy specific absorption ratio (SAR), and other indicators measuring the transmit chain module.

In some embodiments, the signal processing unit may further include a memory, which may store relevant performance parameters of the coupler. The memory may be an existing RAM memory, flash memory, removable medium, hard drive, ROM memory, EPROM memory, EEPROM memory, etc., and the embodiments of the present application are not limited thereto.

The controller may be a separate modular component or may be placed in the signal processing unit or the signal output unit, or, alternatively, the functions of the controller may be integrated into the signal processing unit or the signal output unit, and the embodiments of the present application are not limited thereto.

The impedance matching circuit and the signal processing unit can be integrated into the same circuit. For example, the coupler of the signal processing unit is arranged between the radio-frequency power amplifier and the impedance matching circuit, but the embodiments of present application are not limited thereto.

For the sake of simplicity, the figures only exemplarily illustrate the connection relationship or signal direction between various components or modules, but it should be clear to those skilled in the art that various related technologies such as bus connection can be used. The various components or modules can be implemented by means of a hardware facility such as a processor or a memory, etc. The embodiments of the present application are not limited thereto.

It should be noted that the transmission apparatus may further include components not shown in the figure. For details, reference may be made to the related art, and details will not be described again here.

The above embodiments merely provide illustrative descriptions of the embodiments of the present application. However, the present application is not limited thereto, and appropriate variations may be made on the basis of the above embodiments. For example, each of the above embodiments may be used independently, or one or more among the above embodiments may be combined.

As can be seen in the above embodiments, the first phase is selected among the plurality of adjustable phases, and the impedance matching circuit is controlled according to the first phase to adjust the output impedance to perform impedance matching, thereby implementing the conversion from the high VSWR to the low VSWR (for example, the VSWR is reduced to less than or equal to the first threshold), mitigating load mismatch, and reducing the impact of the load changes on the performance of the radio-frequency power amplifier. Moreover, the transmission apparatus can operate in a strong magnetic field environment, which can meet the miniaturization requirements of the transmission apparatus, and also has lower costs.

The embodiments of the present application further provide a transmission method of a magnetic resonance system. The same content as that of the embodiments of the previous aspect will not be described again.

FIG. 12 is a schematic diagram of a transmission method of a magnetic resonance system according to an embodiment of the present application. As shown in FIG. 12, the transmission method of the magnetic resonance system includes: at step 1201, generating and outputting a pulse signal by a signal output unit, amplifying the pulse signal by a radio-frequency power amplifier, and transferring, by an impedance matching circuit, the signal amplified by the radio-frequency power amplifier to a transmit coil of the magnetic resonance system.

At step 1202, the transmission method includes determining a first phase among a plurality of adjustable phases that enables a performance indicator of the radio-frequency power amplifier to meet a first condition, and adjusting an output impedance of the impedance matching circuit at least according to the first phase.

In some embodiments, the method may further include obtaining a first standing wave ratio. When the first standing wave ratio is greater than the first threshold, 1202 is executed. In order to obtain a first standing wave ratio, the first switch circuit controls each phase line to be short-circuited, and the second switch circuit controls each capacitor to be turned off.

FIG. 13 is a schematic diagram of determining a first phase in an embodiment of the present application. As shown in FIG. 13, the determination includes: at step 1301, controlling, according to a plurality of adjustable phases, an impedance matching circuit to adjust a phase of an output impedance multiple times, and determining a performance indicator after each adjustment of the phase of the output impedance.

At step 1302, the method includes selecting an optimal performance indicator from the performance indicators determined multiple times, and determining an adjustable phase corresponding to the optimal performance indicator as a first phase.

In some embodiments, in 1301, controlling the impedance matching circuit to adjust the phase of the output impedance multiple times includes: superimposing the plurality of adjustable phases separately on an original phase of the output impedance to adjust the phase of the output impedance, the plurality of adjustable phases being in a range of 0° to 180°, wherein the plurality of adjustable phases differ in sequence by a first predetermined value.

FIG. 14 is a schematic diagram of adjusting an output impedance in an embodiment of the present application. As shown in FIG. 14, the adjustment includes: at step 1401, determining a second phase according to a first phase and a second predetermined value.

At step 1402, the adjustment method includes determining a first capacitance value corresponding to a first standing wave ratio; and finally at step 1403, adjusting the output impedance according to the second phase and the first capacitance value.

Optionally, the method may further include: at step 1404, after adjusting the output impedance according to the second phase and the first capacitance value, obtaining a second standing wave ratio. At step 1405, the method includes when the second standing wave ratio is greater than the first threshold, determining a third phase according to the second phase and a third predetermined value; and at step 1406 the method includes adjusting the output impedance according to the third phase and the first capacitance value.

Figure 15:
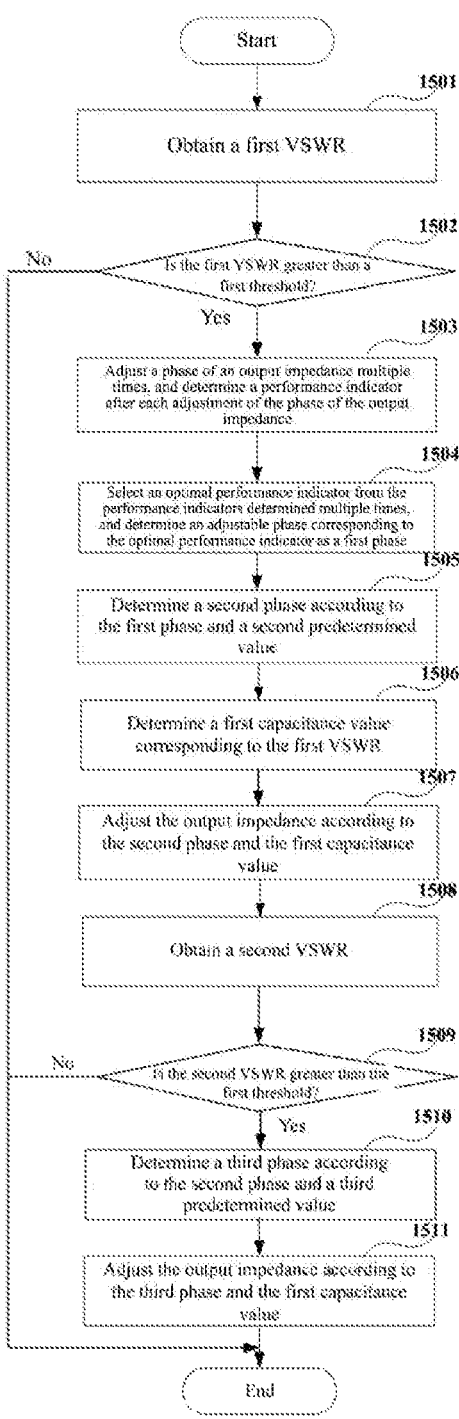
FIG. 15 is a schematic diagram of an impedance matching method according to an embodiment of the present application.

FIG. 15 is a schematic diagram of an impedance matching method according to an embodiment of the present application. As shown in FIG. 15, the method includes: at step 1501, obtaining a first VSWR. At step 1502, the method includes when the first VSWR is greater than a first threshold, executing step 1503, otherwise, refraining from performing impedance matching and ending the process. At step 1503, the method includes controlling, according to a plurality of adjustable phases, an impedance matching circuit to adjust a phase of an output impedance multiple times, and determining a performance indicator after each adjustment of the phase of the output impedance. The method further includes at step 1504, selecting an optimal performance indicator from the performance indicators determined multiple times, and determining an adjustable phase corresponding to the optimal performance indicator as a first phase. The method also includes at step 1505, determining a second phase according to the first phase and a second predetermined value; at step 1506, determining a first capacitance value corresponding to the first VSWR; at step 1507, adjusting the output impedance according to the second phase and the first capacitance value. Further, the method includes at step 1508, obtaining a second VSWR, at step 1509, when the second VSWR is greater than the first threshold, executing step 1510, otherwise ending the process. The step 1510 determines a third phase according to the second phase and a third predetermined value; and at step 1511 the method includes adjusting the output impedance according to the third phase and the first capacitance value.

For the implementation of each operation, reference may be made to the aforementioned embodiments, which will not be described again here.

It should be noted that FIGS. 12 to 15 above merely schematically illustrate the embodiments of the present application, but the present application is not limited thereto. For example, the order of execution between operations may be appropriately adjusted. In addition, some other operations may be added or some operations may be omitted. Those skilled in the art could make appropriate variations according to the above content, rather than being limited by the disclosure of FIGS. 12 to 15 described above.

The above embodiments merely provide illustrative descriptions of the embodiments of the present application. However, the present application is not limited thereto, and appropriate variations may be made on the basis of the above embodiments. For example, each of the above embodiments may be used independently, or one or more among the above embodiments may be combined.

As can be seen by the above embodiments, the first phase is selected among the plurality of adjustable phases, and the impedance matching circuit is controlled according to the first phase to adjust the output impedance to perform impedance matching, thereby implementing the conversion from the high VSWR to the low VSWR (for example, the VSWR is reduced to less than or equal to the first threshold), mitigating load mismatch, and reducing the impact of the load changes on the performance of the radio-frequency power amplifier. Moreover, the transmission apparatus can operate in a strong magnetic field environment, which can meet the miniaturization requirements of the transmission apparatus, and also has lower costs.

An embodiment of the present application further provides a magnetic resonance imaging system.

Figure 16:
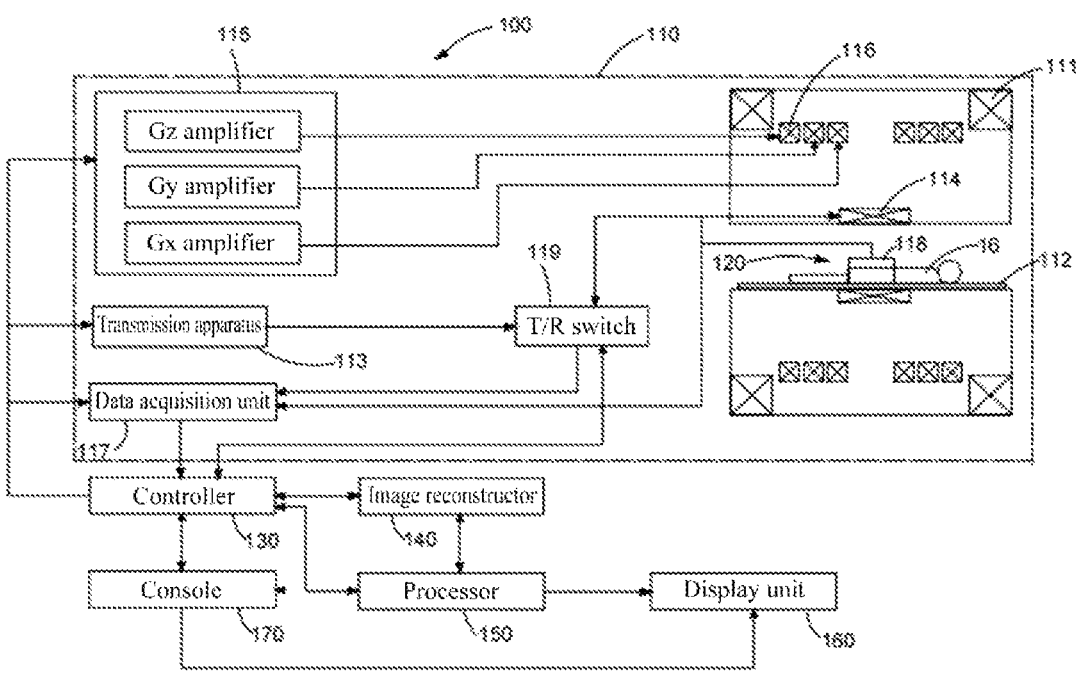
FIG. 16 is a schematic diagram of a magnetic resonance imaging system according to an embodiment of the present application.

FIG. 16 is a schematic diagram of the configuration of the magnetic resonance imaging system. As shown in FIG. 16, the system 1600 includes: a scanning unit 110. The scanning unit 110 is configured to perform a magnetic resonance scan of a subject (e.g., a human body) 16 to generate image data of a region of interest of the subject 16, wherein the region of interest may be a predetermined anatomical site or anatomical tissue.

The magnetic resonance imaging system 1600 may include a controller 130 which is coupled to the scanning unit 110 that indicates an MRI scanning sequence to be performed during the MRI scan, so as to control the scanning unit 110 to perform the aforementioned magnetic resonance scan procedure.

The scanning unit 110 may include a main magnet assembly 111. The main magnet assembly 111 usually includes an annular superconducting magnet defined in a housing. The annular superconducting magnet is mounted in an annular vacuum container. The annular superconducting magnet and the housing thereof define a cylindrical space surrounding the subject 16, such as an imaging space 120 shown in FIG. 1. The main magnet assembly 111 generates a constant magnetic field, i.e., a B0 field, in a Z direction of the imaging space 120.

Usually, the aforementioned Z direction is typically the direction extending from the head to the feet (or from the feet to the head) when the subject 16 is positioned on a table 112. For example, a selected layer may be a slice at any position in the Z direction. A uniform portion of the B0 field is formed in a central region of a main magnet.

The scanning unit 110 further includes the table 112, which is configured to carry the subject 16 and travel, in response to the control of the controller 130, in the Z direction to enter or exit a scanning chamber. For example, in an embodiment, an imaging volume of the subject 16 may be positioned in a central region of the imaging space 120 having uniform magnetic field strength, so as to facilitate scanning and imaging of the imaging volume of the subject 16.

The magnetic resonance imaging system 100 uses the formed B0 field to transmit a static magnetic field to the subject 16 located in the scanning chamber, so that protons in a resonant region in the body of the subject 16 precess in an ordered manner.

The scanning unit 110 further includes a radio-frequency transmit coil 114 and the transmission apparatus 113 in the aforementioned embodiments. For implementations of the transmission apparatus 113, reference may be made to the transmission apparatus in the aforementioned embodiments, and the same content as in the aforementioned embodiments will not be described again here. The radio-frequency transmit coil 114 is configured, for example, to surround a region to be imaged of the subject 16. The radio-frequency transmit coil 114 may include, for example, a body coil arranged along an inner circumference of the main magnet, or a local coil dedicated to local imaging. The transmission apparatus is configured to drive the radio-frequency transmit coil 114 and create a high-frequency magnetic field in a space. The transmission apparatus 113 outputs an amplified pulse signal to the radio-frequency transmit coil 114, causing the radio-frequency transmit coil 114 to transmit a radio-frequency field B1 orthogonal to the B0 field to the subject 16 to excite spinning of protons in the slice to be imaged, and after the radio-frequency excitation pulse ends, a magnetic resonance signal is generated during the process of spin-relaxation of the excited protons returning to an initial magnetization vector.

The aforementioned radio-frequency transmit coil 114 may be connected to a transmit/receive (T/R) switch 119. The transmit/receive switch 119 is controlled so that the radio-frequency transmit coil may be switched between a transmit mode and a receive mode. In the receive mode, the radio-frequency transmit coil may be configured to receive, from the subject 16, a magnetic resonance signal having three-dimensional position information.

The three-dimensional position information of the magnetic resonance signal is generated by means of a gradient system of the MRI system, which will be described in detail below.

The scanning unit 110 further includes a gradient coil driver 115 and a gradient coil assembly 116. The gradient coil assembly 116, in one aspect, forms a magnetic field gradient (a varying magnetic field) in the imaging space 120 so as to provide three-dimensional position information for the aforementioned magnetic resonance signal, and in another aspect, generates a compensating magnetic field of the B0 field to shim the B0 field.

The gradient coil assembly 116 may include three gradient coil systems, and the three gradient coil systems are configured to generate magnetic field gradients that are oblique to three mutually perpendicular spatial axes (for example, the x-axis, y-axis, and z-axis), respectively. The gradient coil driver 115 drives the gradient coil assembly 116 on the basis of a control signal from the controller 130, and therefore generates a gradient magnetic field in the imaging space 120. The gradient coil driver 115 includes gradient amplifiers respectively corresponding to the three gradient coil systems in the aforementioned gradient coil assembly. For example, the gradient coil driver 115 includes a Gz amplifier configured to drive a gradient in a z direction, a Gy amplifier configured to drive a gradient in a y direction, and a Gx amplifier configured to drive a gradient in an x direction.

More specifically, the gradient coil assembly 116 is configured to apply a magnetic field gradient in a slice selection direction (e.g., the z direction) to vary field strength in the region, so that precession frequencies of protons of imaged tissue in different layers (slices) of the region are different and thus layer selection is performed. Those skilled in the art understand that the layer may be any one of a plurality of two-dimensional slices distributed in the Z direction in the three-dimensional imaging volume. When the imaging region is scanned, the radio-frequency transmit coil 114 responds to a radio-frequency excitation signal, then a layer having a precession frequency corresponding to the radio-frequency excitation signal is excited. Further, the gradient coil assembly 116 is configured to separately apply a magnetic field gradient in a phase-encoding direction (e.g., the y direction) and a magnetic field gradient in a frequency-encoding direction (e.g., the x direction), so that magnetic resonance signals of excited layers have different phases and frequencies, thereby achieving phase encoding and frequency encoding.

The scanning unit 110 further includes a surface coil 118 which is usually arranged close to a scanned site (a region of interest) of the subject 16 (for example, covering or disposed on the body surface of the subject 16), and the surface coil 118 is also configured to receive the aforementioned magnetic resonance signal.

The scanning unit 110 further includes a data acquisition unit 117 configured to acquire the aforementioned magnetic resonance signal (for example, received by the body coil or the surface coil) in response to a data acquisition control signal of the controller 130. In an embodiment, the data acquisition unit 117 may include, for example, a radio-frequency preamplifier (not shown in the figure), a phase detector (not shown in the figure), and an analog/digital converter (not shown in the figure). The radio-frequency preamplifier is configured to amplify the magnetic resonance signal. The phase detector is configured to perform phase detection on the amplified magnetic resonance signal. The analog/digital converter is configured to convert the phase-detected magnetic resonance signal from an analog signal into a digital signal.

The data acquisition unit 117 is further configured to store the digitized magnetic resonance signal (or echo) in a K-space in response to a data storage control signal of the controller 130. The K-space is a space filled with raw data of magnetic resonance signals carrying spatial orientation encoding information. The data acquisition unit 117, according to a preset data filling method, fills signals having different phase information and frequency information into corresponding positions in the K-space. In an example, the two-dimensional K-space may include a frequency-encoding line and a phase-encoding line. Data acquisition at each level may include a plurality of signal acquisition cycles (or repetition times TR). Each signal acquisition cycle may correspond to one change in the magnetic field gradient (incrementally or decrementally) in the phase-encoding direction (i.e., one signal acquisition is performed for each applied phase-encoding gradient), and the magnetic resonance signal acquired in each signal acquisition cycle is filled into the frequency-encoding line. Through multiple signal acquisition cycles, multiple frequency-encoding lines having different phase information may be filled, and each acquired magnetic resonance signal has multiple decomposition frequencies.

The magnetic resonance imaging system 100 further includes an image reconstructor 140 configured to perform inverse Fourier transform on data stored in the K-space to reconstruct a three-dimensional image or a series of two-dimensional slice images of the imaging volume of the subject 16. Specifically, the image reconstructor 140 may perform the aforementioned image reconstruction on the basis of communication with the controller 130.

The magnetic resonance imaging system 100 further includes a processor 150. The processor 150 may include an image processor configured to perform image processing, and the image processor may perform any required image post-processing on the aforementioned three-dimensional image or any image in an image sequence. The post-processing may be an improvement or adaptive adjustment made to an image in any aspect of contrast, uniformity, sharpness, brightness, artifacts, etc. The processor 150 may further include a waveform processor configured to perform a waveform determination method according to an embodiment of the present invention. For example, the waveform processor generates a waveform on the basis of scanning parameters, performs waveform conversion, uses a converted waveform to determine driving/controlling parameters of the gradient amplifier, etc.

In an embodiment, the controller of the transmission apparatus 113 may be arranged independently of, or integrated with, the MR system controller 130 and the processor 150. The embodiments of the present application are not limited thereto. The controller 130, the image reconstructor 140, and the processor 150 may separately or collectively include a computer processor and a storage medium on which a program for predetermined data processing to be performed by the computer processor is recorded. For example, the storage medium may store a program for implementing scan processing (e.g., including waveform design/conversion, etc.), image reconstruction, image processing, etc., and the aforementioned storage medium may include, for example, a ROM, a floppy disk, a hard disk, an optical disk, a magneto-optical disk, a CD-ROM, or a non-volatile memory card.

The magnetic resonance imaging system 100 further includes a display unit 160, and the display unit 160 may be configured to display an operation interface and various data, images, or parameters generated during data acquisition and processing processes.

The magnetic resonance imaging system 100 further includes an operation console 170, and the operation console 170 may include a user input device, such as a keyboard, a mouse, etc. The controller 130 may communicate with the scanning unit 110, the image reconstructor 140, the processor 150, the display unit 160, etc., in response to a control command generated by a user on the basis of the operation console 170 or an operation panel/button, etc., provided on the housing of the main magnet.

Those skilled in the art can understand that when imaging scanning is performed on the subject 16, the controller 130 can use a sequence generator (not shown in the figure) to send sequence control signals to the aforementioned components (for example, the transmission apparatus 113, the gradient coil driver 115, etc.) of the scanning unit 110, so that the scanning unit 110 executes a preset scanning sequence.

Those skilled in the art can understand that the aforementioned "scanning sequence" (hereafter also referred to as imaging sequence or pulse sequence) refers to a combination of pulses having specific amplitudes, widths, directions, and timings and applied when a magnetic resonance imaging scan is performed. The pulses may typically include, for example, a radio-frequency pulse and a gradient pulse. The radio-frequency pulse may include, for example, a radio-frequency transmission pulse, a radio-frequency refocus pulse, an inverse recovery pulse, etc. The gradient pulse may include, for example, the aforementioned gradient pulse for layer selection, gradient pulse for phase encoding, gradient pulse for frequency encoding, phase balance pulse for phase balancing of proton precession, etc. Typically, a plurality of scanning sequences can be pre-set in the magnetic resonance imaging system, so that the sequence suitable for clinical examination requirements can be selected. The clinical examination requirements may include, for example, an imaging site, an imaging function, an imaging effect, etc.

Embodiments of the present invention further provide a scanning method of a magnetic resonance system, the method including: performing a pre-scan center frequency search and executing the transmission method.

In some embodiments, with reference to FIG. 16, after a subject to be scanned enters a scanning chamber (that is, an imaging space defined by the main magnet), scanning parameter setting can be performed. For example, the scanning parameter setting can be performed using the input device on the basis of a part under detection. The scanning parameter setting includes various conventional settings of scanning parameters such as a scanning range, a scanning protocol, etc.

During the process of pre-scanning, the center frequency needs to be corrected first to determine the best resonant frequency. The correction process includes: searching for a center frequency, and the found center frequency should be the same as the precession frequency of the protons within the subject to be scanned.

In the transmission method, the signal output unit generates a set of pulse signals (such as Tg 0), and the set of pulse signals is amplified by the RF amplifier and then outputted to the impedance matching circuit. The impedance matching circuit performs impedance tuning as described previously to implement impedance matching. After that, the state of each switch in the impedance matching circuit is maintained, and then the signal output unit generates a set of pulse signals having the center frequency (such as the scanning sequence pulse signals used in formal scanning) for formal scanning to obtain magnetic resonance images.

Alternatively, the signal output unit generates a set of pulse signals having the center frequency (such as the scanning sequence pulse signals used in formal scanning), and the set of pulse signals is amplified by the RF amplifier and then outputted to the impedance matching circuit. The impedance matching circuit performs impedance tuning as described previously to implement impedance matching, and the pulse signals are used to perform formal scanning to obtain magnetic resonance images.

In some embodiments, if there is a next scanned subject to be scanned, then the aforementioned scanning method is executed again.

The embodiments of the present application further provide an impedance matching circuit. As shown in FIG. 5, the impedance matching circuit includes a capacitance adjustment circuit 501 and a phase tuning circuit 502 connected in series. The capacitance adjustment circuit 501 includes one or more capacitors 5011 connected in parallel, and a second switch circuit 5012. The second switch circuit 5012 separately controls the one or more capacitors to be in an on or off state. For the structure of the phase tuning circuit 502, reference may be made to FIG. 4. For example, the phase tuning circuit includes P phase lines connected in series and a first switch circuit. The first switch circuit is configured to separately control the P phase lines to be in an on state or a short-circuit state, where the value of P is a positive integer greater than or equal to 2.

In some embodiments, the impedance matching circuit may be applied between amplifier circuits at various stages, or between an amplifier circuit and a load, or between a signal and a transmission circuit, etc. The embodiments of the present application are not limited thereto. For example, the impedance matching circuit is located between the amplifier and the transmit coil. One end of the capacitance adjustment circuit 501 is connected to the output of the amplifier, and the other end is connected to the phase tuning circuit 502. The phase tuning circuit 502 is also connected to the transmit coil. For a method of performing impedance matching by using the impedance matching circuit, reference may be made to FIG. 15 described previously, and it will not be described again here.

In some embodiments, when the impedance matching circuit is applied to the transmission apparatus of the magnetic resonance system, the controller 204 can also use a high-voltage signal and a current source signal of the transmission apparatus to control at least one of the first switch circuit and the second switch circuit. That is, the high-voltage signal and the current source signal of the transmission apparatus can be used as a control signal of the first switch circuit to control each phase line to be turned on or short-circuited, and the high-voltage signal and the current source signal of the transmission apparatus can be used as a control signal of the second switch circuit to control each capacitor to be turned on or off. The high-voltage signal and the current source signal can be an existing biasing signal of a radio-frequency front-end diode in the magnetic resonance transmission apparatus. For implementations of the switch circuits, reference may be made to the related art, and the embodiments of the present application are not limited thereto.

The embodiments of the present application further provide a computer-readable program. When the program is executed in a transmission apparatus or an MRI system, the program causes a computer to perform, in the transmission apparatus or the MRI system, the method according to the embodiments.

The embodiments of the present application further provide a storage medium having a computer-readable program stored therein. The computer-readable program causes a computer to perform, in a transmission apparatus or an MRI system, the method according to the embodiments.

The above apparatus and method of the present application can be implemented by hardware, or can be implemented by hardware in combination with software. The present application relates to the foregoing type of computer-readable program. When executed by a logic component, the program causes the logic component to implement the foregoing apparatus or a constituent component, or causes the logic component to implement various methods or steps as described above. The present application further relates to a storage medium for storing the above program, such as a hard disk, a magnetic disk, an optical disk, a DVD, a flash memory, etc.

The method/apparatus described with reference to the embodiments of the present application may be directly embodied as hardware, a software module executed by a processor, or a combination of the two. For example, one or more of the functional block diagrams and/or one or more combinations of the functional block diagrams as shown in the drawings may correspond to either software modules or hardware modules of a computer program flow. The foregoing software modules may respectively correspond to the steps shown in the figures. The foregoing hardware modules may be implemented, for example, by firming the foregoing software modules by using a field-programmable gate array (FPGA).

The software modules may be located in a RAM memory, a flash memory, a ROM memory, an EPROM memory, an EEPROM memory, a register, a hard disk, a removable disk, a CD-ROM, or any storage medium in other forms known in the art. The storage medium may be coupled to a processor, so that the processor can read information from the storage medium and can write information into the storage medium. Alternatively, the storage medium may be a component of the processor. The processor and the storage medium may be located in an ASIC. The software module may be stored in a memory of a mobile terminal, and may also be stored in a memory card that can be inserted into a mobile terminal. For example, if a device (such as a mobile terminal) uses a large-capacity MEGA-SIM card or a large-capacity flash memory apparatus, then the software modules may be stored in the MEGA-SIM card or the large-capacity flash memory apparatus.

One or more functional blocks and/or one or more combinations of the functional blocks shown in the drawings may be implemented as a general-purpose processor, a digital signal processor (DSP), an application-specific integrated circuit (ASIC), a field-programmable gate array (FPGA) or other programmable logic devices, a discrete gate or transistor logic device, a discrete hardware assembly, or any appropriate combination thereof, which is used for implementing the functions described in the present application. The one or more functional blocks and/or the one or more combinations of the functional blocks shown in the drawings may also be implemented as a combination of computing equipment, such as a combination of a DSP and a microprocessor, a plurality of microprocessors, one or more microprocessors in communication combination with a DSP, or any other such configuration.

The present application is described above with reference to specific embodiments. However, it should be clear to those skilled in the art that the foregoing description is merely illustrative and is not intended to limit the scope of protection of the present application. Various variations and modifications may be made to the present application by those skilled in the art according to the principle of the present application, and said variations and modifications also fall within the scope of the present application.

What is claimed is:

1. A transmission method of a magnetic resonance system, characterized by comprising:

generating and outputting a pulse signal by a signal output unit, amplifying the pulse signal by a radio-frequency power amplifier, and transferring, by an impedance matching circuit, the signal amplified by the radio-frequency power amplifier to a transmit coil of the magnetic resonance system; and determining a first phase among a plurality of adjustable phases that enables a performance indicator of the radio-frequency power amplifier to meet a first condition, and adjusting an output impedance of the impedance matching circuit at least according to the first phase.

2. The method according to claim 1, further comprising:

obtaining a first standing wave ratio; and when the first standing wave ratio is greater than a first threshold, determining the first phase.

3. The method according to claim 1, wherein the step of determining the first phase among the plurality of adjustable phases comprises:

controlling, according to the plurality of adjustable phases, the impedance matching circuit to adjust a phase of the output impedance multiple times, and determining the performance indicator after each adjustment of the phase of the output impedance; and selecting an optimal performance indicator from the performance indicators determined multiple times, and determining an adjustable phase corresponding to the optimal performance indicator as the first phase.

4. The method according to claim 3, wherein controlling the impedance matching circuit to adjust the phase of the output impedance multiple times comprises: superimposing the plurality of adjustable phases separately on an original phase of the output impedance to adjust the phase of the output impedance, the plurality of adjustable phases being in a range of 0° to 180°, wherein the plurality of adjustable phases differ in sequence by a first predetermined value.

5. The method according to claim 4, wherein the first predetermined value comprises 15°.

6. The method according to claim 1, wherein the performance indicator comprises gain.

7. The method according to claim 2, wherein the step of adjusting the output impedance at least according to the first phase comprises:

determining a second phase according to the first phase and a second predetermined value;

determining a first capacitance value corresponding to the first standing wave ratio; and adjusting the output impedance according to the second phase and the first capacitance value.

8. The method according to claim 7, further comprising:

after adjusting the output impedance according to the second phase and the first capacitance value, obtaining a second standing wave ratio;

when the second standing wave ratio is greater than the first threshold, determining a third phase according to the second phase and a third predetermined value; and adjusting the output impedance according to the third phase and the first capacitance value.

9. A transmission apparatus of a magnetic resonance system, characterized by comprising:

a signal output unit, configured to generate and output a pulse signal;

a radio-frequency power amplifier, configured to amplify the pulse signal;

an impedance matching circuit, which transfers the signal amplified by the radio-frequency power amplifier to a transmit coil of the magnetic resonance system in the same space as the radio-frequency power amplifier; and a controller, which determines a first phase among a plurality of adjustable phases that enables a performance indicator of the radio-frequency power amplifier to meet a first condition, and adjusts an output impedance of the impedance matching circuit at least according to the first phase.

10. The apparatus according to claim 9, wherein the impedance matching circuit comprises one or more capacitors connected in parallel, and a phase tuning circuit connected in series with the one or more capacitors, wherein the one or more capacitors are further connected with the radio-frequency power amplifier, and the phase tuning circuit is further connected with the transmit coil of the magnetic resonance system.

11. The apparatus according to claim 10, wherein the phase tuning circuit comprises P phase lines and a first switch circuit connected in series, the first switch circuit is configured to separately control the P phase lines to be in an on state or a short-circuit state, and the value of P is a positive integer greater than or equal to 2; and the one or more capacitors are connected with the radio-frequency power amplifier via a second switch circuit, and the second switch circuit separately controls the one or more capacitors to be in an on or off state.

12. The apparatus according to claim 11, wherein P=4, and the P phase lines have phases of 15°, 30°, 45° and 90°, respectively.

13. The apparatus according to claim 11, wherein the controller controls the first switch circuit of the impedance matching circuit to separately adjust the P phase lines to be in the on or short-circuit state, so as to control, according to the plurality of adjustable phases, the impedance matching circuit to adjust a phase of the output impedance multiple times, and determine the performance indicator after each adjustment of the phase of the output impedance;

an optimal performance indicator is selected from the performance indicators determined multiple times, and an adjustable phase corresponding to the optimal performance indicator is determined as the first phase.

14. The apparatus according to claim 11, wherein the controller determines a second phase according to the first phase and a second predetermined value, determines a first capacitance value corresponding to a first standing wave ratio, and adjusts the output impedance according to the second phase and the first capacitance value.

15. The apparatus according to claim 14, wherein the controller controls the second switch circuit according to the first capacitance value to adjust the one or more capacitors to be in the on or off state, and controls the first switch circuit according to the second phase to separately adjust the P phase lines to be in the on or short-circuit state, so as to adjust the output impedance.

16. The apparatus according to claim 15, wherein after the one or more capacitors are adjusted to be in the on or off state, a parallel capacitance value in the impedance matching circuit is the first capacitance value.

17. The apparatus according to claim 15, wherein after the P phase lines are separately adjusted to be in the on or short-circuit state, phases of the phase lines connected in series in the impedance matching circuit are associated with the second phase.

18. The apparatus according to claim 14, wherein the controller obtains a second standing wave ratio after adjusting the output impedance; and when the second standing wave ratio is greater than a first threshold, a third phase is determined according to the second phase and a third predetermined value, and the output impedance is adjusted according to the third phase and the first capacitance value.

19. The apparatus according to claim 18, wherein the controller controls the second switch circuit according to the first capacitance value to adjust the one or more capacitors to be in the on or off state, and controls the first switch circuit according to the third phase to separately adjust the P phase lines to be in the on or short-circuit state, so as to adjust the output impedance.

20. A magnetic resonance system, wherein the system comprises:

a transmit coil; and the transmission apparatus according to claim 9.

* * * * *